United States Patent

Mueller et al.

(10) Patent No.: US 10,345,345 B2
(45) Date of Patent: Jul. 9, 2019

(54) FIBER-OPTIC CURRENT SENSOR WITH SPUN FIBER AND TEMPERATURE COMPENSATION

(71) Applicant: ABB Research Ltd., Zurich (CH)

(72) Inventors: Georg Mueller, Glattpark (CH); Xun Gu, Neuenhof (CH); Klaus Bohnert, Oberrohrdorf (CH); Andreas Frank, Zurich (CH)

(73) Assignee: ABB Research Ltd., Zurich (CH)

( * ) Notice: Subject to any disclaimer, the term of this patent is extended or adjusted under 35 U.S.C. 154(b) by 839 days.

(21) Appl. No.: 14/864,422

(22) Filed: Sep. 24, 2015

(65) Prior Publication Data

US 2016/0033556 A1 Feb. 4, 2016

Related U.S. Application Data

(63) Continuation of application No. PCT/EP2013/056784, filed on Mar. 28, 2013.

(51) Int. Cl.
*G01R 15/24* (2006.01)
*G01R 33/032* (2006.01)

(52) U.S. Cl.
CPC ........ *G01R 15/246* (2013.01); *G01R 33/0322* (2013.01)

(58) Field of Classification Search
CPC ..... G01R 15/246; G01R 15/247; G01R 19/32
See application file for complete search history.

(56) References Cited

U.S. PATENT DOCUMENTS

| 4,797,607 | A  |   | 1/1989  | Dupraz              |             |
|-----------|----|---|---------|---------------------|-------------|
| 5,553,173 | A  | * | 9/1996  | Lutz .............   | G01R 15/246 |
|           |    |   |         |                     | 242/159     |
| 5,587,791 | A  | * | 12/1996 | Belleville .......  | G01R 15/246 |
|           |    |   |         |                     | 356/483     |
| 5,677,622 | A  | * | 10/1997 | Clarke ............. | G01R 15/246 |
|           |    |   |         |                     | 324/96      |
| 2002/0006244 | A1 | * | 1/2002 | Bohnert ........... | G01R 15/246 |
|           |    |   |         |                     | 385/12      |
| 2004/0246467 | A1 |  | 12/2004 | Bohnert et al.    |             |
| 2009/0039866 | A1 | * | 2/2009 | Bohnert ........... | G01R 15/246 |
|           |    |   |         |                     | 324/97      |
| 2011/0072858 | A1 | * | 3/2011 | Wueest ............. | G01R 3/00   |
|           |    |   |         |                     | 65/485      |

(Continued)

FOREIGN PATENT DOCUMENTS

DE  10000306 A1  7/2001
EP   1154278 A2  11/2001

(Continued)

OTHER PUBLICATIONS

R.C. Jones, "A new calculus for the treatment of optical systems", J. Opt. Soc. Am., vol. 31, pp. 488-493 (1941).

(Continued)

*Primary Examiner* — Huy Q Phan
*Assistant Examiner* — Adam S Clarke
(74) *Attorney, Agent, or Firm* — Whitmyer IP Group LLC

(57) ABSTRACT

A fiber-optic current sensor uses a highly-birefringent spun fiber as sensing fiber. The light is fed through a retarder, which is a detuned quarter-wave or half-wave retarder. It is shown that such detuning can be used to compensate for temperature dependencies of the sensing head.

21 Claims, 10 Drawing Sheets

(56) References Cited

U.S. PATENT DOCUMENTS

2015/0115934 A1* 4/2015 Mueller ............... G01R 15/246
324/96

FOREIGN PATENT DOCUMENTS

| EP | 1512981 A1 | 3/2005 |
|---|---|---|
| EP | 2306212 A1 | 4/2011 |
| WO | 9523977 A1 | 9/1995 |
| WO | 9713155 A1 | 4/1997 |
| WO | 2007121592 A1 | 11/2007 |
| WO | 2011069558 A1 | 6/2011 |

OTHER PUBLICATIONS

R. Dändliker, "Rotational Effects of Polarization in Optical Fibers". In: Anisotropic and Nonlinear Optical Waveguides, C.G. Someda and G. Stegman (Eds.), Elsevier (1992), pp. 39-76.

D. Tang, A. H. Rose, G. W. Day, and S. M. Etzel, "Annealing of linear birefringence in single-mode fiber coils: applications to optical fiber current sensors", J. Lightwave Technology 9, pp. 1031-1037 (1991).

R. I. Laming and D. N. Payne, "Electric current sensors employing spun highly birefringent optical fibers", J. Lightwave Technology 7, pp. 2084-2094 (1989).

K. Bohnert et al., "Fiber-Optic Current Sensor for Electrowinning of Metals", J. Lightwave Technology, vol. 25, pp. 3602-3609 (2007).

K. Kurosawa et al., "Flexible fiber Faraday effect current sensor using flint glass fiber and reflection scheme", IEICE Trans. Electron. vol. E83-C, pp. 326-330 (2000) and Optical Fibre Sensors Conference 13, 1999 Apr. 12-16, 1999, Kyongju, Korea.

International Search Report and Written Opinion of the International Searching Authority Application No. PCT/EP2013/056784 Completed: Dec. 17, 2013; dated Jan. 2, 2014 15 pages.

F. Briffod et al., "Polarimetric current sensor using in-line Faraday rotator", IEICE Trans. Electron. vol. E83-C, pp. 331-335 (2000).

G. Frosio and R. Dändliker, "Reciprocal reflection interferometer for a fiber-optic Faraday effect current sensor", Appl. Opt. vol. 33, pp. 6111-6122 (1994).

A. Michie et al., "Spun elliptically birefringent photonic crystal fibre", Opt. Expr. vol. 15, pp. 1811-1816 (2007).

J.R. Qian, Q. Guo, and L. Li, "Spun linear birefringence fibres and their sensing mechanism in current sensors with temperature compensation", IEE Proc. Optoelectronics vol. 141, pp. 357-380 (1994).

K. Bohnert, P.Gabus, J. Nehring, and H. Brändle, "Temperature and vibration insensitive fiber-optic current sensor", J. Lightwave Technology vol. 20, pp. 267-276 (2002).

I. G. Clarke, "Temperature-stable spun elliptical-core optical-fiber current transducer", Optical Letters vol. 18, pp. 158-160 (1993).

"The fiber-optic gyroscope", Herve Lefevre, Artech House, Boston, London, 1993.

* cited by examiner

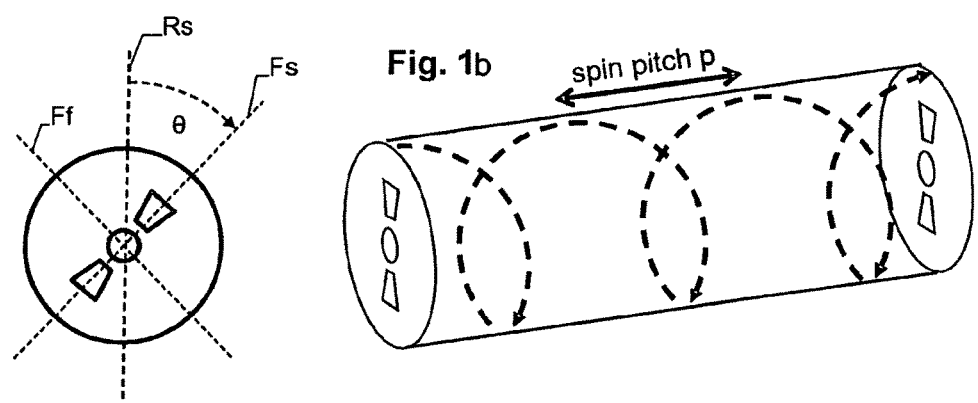
Fig. 1a
Fig. 1b
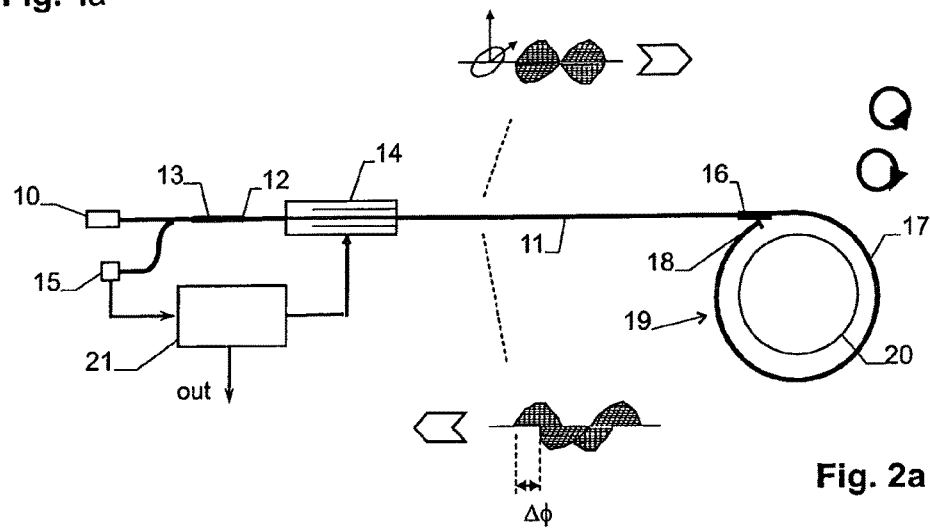
Fig. 2a
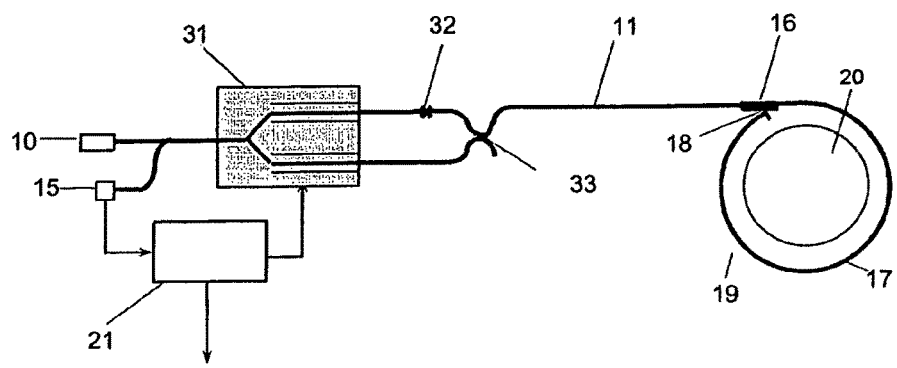
Fig. 2b

FIBER-OPTIC CURRENT SENSOR WITH SPUN FIBER AND TEMPERATURE COMPENSATION

FIELD OF THE INVENTION

The invention relates to a fiber-optic current sensor with a strongly birefringent spun fiber.

BACKGROUND OF THE INVENTION

Fiber-optic current sensors commonly rely on the Faraday effect in a fused silica fiber. The sensing fiber forms a coil around a conductor that carries the current to be measured. The Faraday effect is observed either as a rotation of the polarization of linearly polarized light or equivalently as a differential phase shift between left and right circularly polarized light waves. In the latter case, the circular light states are commonly produced at the entrance to the sensing fiber by a short section of polarization-maintaining fiber acting as a quarter-wave retarder (QWR). Such a sensor is then designed in a reflective configuration with a mirror at the opposite end of the sensing fiber [1, 2]. Alternatively the sensor may be designed as a Sagnac-type interferometer [2] with QWRs (quarter-wave retarders) at both sensing fiber ends and light waves of the same sense of circular polarization that are counter-propagating in the sensing fiber.

For precise current measurement over a wide temperature range, it is important to maintain the circular polarization states of the light waves in the sensing fiber. Mechanical stress in the fiber, which may be present due to bending of the fiber to a coil, fiber packaging, or hardening of the coating at low temperatures, has a significant influence on the evolution of light polarization in the fiber and may result in an unstable and temperature-dependent signal. Bend-induced stress can limit the possible number of fiber loops, particularly at small loop diameters, to a few loops. As a result the minimum detectable current at a given detection bandwidth (measuring time) is then limited correspondingly.

Thermal annealing of the fiber coils has been used to remove bend-induced stress, but tends to be a sophisticated and time-consuming procedure [2, 3]. In Refs. [4] and [5], the bare fiber resides in a thin capillary of fused silica. The method prevents fiber stress from the coating and fiber packaging. Again the removal of the coating and the insertion of the fiber into a capillary is a time consuming effort.

Laming and Payne showed that the usage of the so-called highly-birefringent spun fiber as a sensing fiber reduces the influence to external mechanical perturbations [6]. Commonly, a spun fiber has a spiral-shaped internal stress field which results in an elliptical birefringence. The parameter of the fiber are commonly chosen so that the eigenmodes of such a fiber are close to left and right circularly polarized light waves. This elliptical birefringence essentially quenches the disturbing effects of linear birefringence, e.g. from bend-induced stress.

The elliptical birefringence may also be produced by an elliptical fiber core that rotates along the fiber [7] or by an adequate fiber micro-structure [8].

Laming and Payne have also demonstrated that the current measurement can delicately depend on the spun fiber parameters, in particular the linear beat length of the corresponding un-spun fiber and the spin pitch, which themselves may vary with temperature [6]. These effects can be reduced by using a broadband light source. Furthermore, Laming and Payne have shown that the angular alignment of the spun fiber with respect to the polarization direction of incoming light has a significant influence on the fiber sensor characteristics, In Ref [9] the retarder that produces the circular light waves in the (non-spun) sensing fiber was intentionally detuned from perfect 90° retardation. The light waves entering the sensing fiber are then slightly elliptical. If the retarder is detuned by a proper amount, the variation of the sensor scale factor as a result of the temperature dependence of the retarder largely compensates the temperature dependence of the Faraday effect of the non-spun fiber. The sensor signal is then widely independent of temperature. The sensing fiber [9] was an essentially stress-free annealed fiber. In Ref [5] the method was adapted to temperature compensate non-annealed fiber coils having a given amount of bend-induced stress.

Fiber-optic current sensors of the type above can employ a modulator for non-reciprocal modulation of the differential phase of the two interfering light waves in order to operate the interferometer at optimum sensitivity, a technique that has originally been developed for fiber gyroscopes [10].

Alternatively, fiber-optic current sensors can use passive optical elements to generate the phase bias of the light waves. The corresponding conventional sensor configurations employ low birefringent sensing fibers and have been disclosed e.g. in reference [11]. Ref [11] discloses a fiber-optic current sensor where a quarter-wave retarder which is part of a polarization splitter module produces the phase bias; further prior art regarding this sensor configuration can be found in Refs. [12] and [13]. Moreover, Refs. [6] and [14] present prior art on current sensing with highly birefringent spun fibers and purely passive optical detection schemes.

SUMMARY OF THE INVENTION

The problem to be solved by the present invention is therefore to provide a fiber-optic current sensor with highly birefringent spun fiber and good temperature compensation.

This problem is solved by the current sensor of claim 1. Accordingly, the fiber-optic current sensor comprises a light source generating light in a wavelength range, a first linear polarizer receiving light from the light source and generating polarized light, a retarder receiving light from the first linear polarizer and having a retardation $\rho = n \cdot 90° + \varepsilon$, with n being an integer number, a spun sensing fiber being wound N times into a loop to be placed around a current carrier, having a Verdet-constant V, a spin pitch $p \leq 100$ mm, and, in said wavelength range, an average linear beat length $\overline{L_{LB}} \leq 200$ mm (in particular $p \leq 15$ mm and $\overline{L_{LB}} \leq 30$ mm), wherein an input end of the spun sensing fiber receives light from the retarder, wherein a slow axis of the retarder is under an angle $\theta$ to a slow axis of the input end, a detector assembly adapted to determine a phase shift $\Delta \phi$ between two polarization modes of light returning from the spun sensing fiber and to generate a signal indicative of the current, characterized in that the retardation $\rho$ is such that, for a given nominal magneto-optical phase shift 4NVI, temperature changes of the retarder yield variations of a temperature-smoothed normalized sensor scale factor $SF'(\rho, \overline{L_{LB}}, p, \theta, NVI, \delta_b)$ that balance scale factor variations due to temperature changes of the spun sensing fiber in the sense that, at least for 4NVI being in a given nominal phase shift range $[\Delta\phi_{min}, \Delta\phi_{max}]$ with $|\Delta\phi_{max} - \Delta\phi_{min}| \geq 10°$, we have $$\left|\frac{1}{SF'}\frac{dSF'}{dT}\right| < \left|\frac{1}{V}\frac{dV}{dT}\right| \text{ with}$$

$$\frac{dSF'}{dT} = \frac{d\rho}{dT}\frac{dSF'}{d\rho} + \frac{d\overline{L_{LB}}}{dT}\frac{dSF'}{d\overline{L_{LB}}} + \frac{dp}{dT}\frac{dSF'}{dp} + \frac{dV}{dT}\frac{dSF'}{dV} + \frac{d\delta_b}{dT}\frac{dSF'}{d\delta_b}.$$

wherein said temperature-smoothed normalized scale factor SF' is defined as an average of a non-temperature-smoothed normalized scale factor $SF=\Delta\phi/(4NV_0I)$ over a temperature range that has a width of 20° C. (in other words, SF' is defined as the average of SF over a temperature range of 20° C.) and wherein the temperature T is within an operating temperature range from, e.g., −55° C. to 120° C. and wherein $V_0$ is the Verdet constant at a reference temperature, e.g., at the room temperature. The quantity $\Delta_b$ represents the total bend-induced birefringence of the sensor coil (or more precisely the birefringent phase retardation), which can impact the scale factor, if it exceeds a certain level, and can add an additional temperature contribution to the scale factor.

In other words, the above relations request that the retardation ρ is chosen such that the percental change of the normalized scale factor SF' with temperature is smaller than the percental change of the Verdet constant V with temperature, i.e. the retarder is dimensioned such that it introduces a temperature dependence that counteracts the combined contributions to the scale factor temperature dependence of the Verdet constant V, the linear beat length $\overline{L_{LB}}$, the spin pitch p, and the bend-induced birefringence $\delta_b$. The absolute value of the relative change of the normalized scale factor SF' can be lower than $0.7\times10^{-4}$ per ° C., preferably lower than $0.2\times10^{-4}$ per ° C., or even more preferred lower than $0.1\times10^{-4}$ per ° C. in the operating range. The inequality is defined by reference to a "temperature-smoothed normalized scale factor" SF', because the non-temperature-smoothed normalized scale factor SF can exhibit comparatively strong oscillations within a few ° C. The temperature-smoothed normalized scale factor SF' can be obtained by a (weighted or non-weighted) average of the non-temperature-smoothed normalized scale factor SF over a temperature range of 20° C., such as the non-weighted average $$SF'(T_0) = \frac{1}{20°\text{ C.}}\int_{T_0-10°\text{ C.}}^{T_0+10°\text{ C.}} SF(T)\,dT,$$

with $T_0$ being a given operating temperature of the current sensor, such as 20° C.

Note that SF' and SF typically coincide, if the highly-birefringent spun sensing fiber is chosen long enough.

As explained below in more detail, a thorough analysis of the mode propagation in a spun, highly-birefringent fiber of this type in the presence of a magnetic field has shown that the variation of the magneto-optic phase shift due to an operating temperature change can be compensated by selecting a retarder of a suitable retardation ρ.

The nominal phase shift range, where the compensation holds, can be selected according to the desired operating condition or current of the device and can e.g. extend at least over a range of ±[0°, 30°] and/or ±[30°, 90°] and/or ±[90°, 180°] and/or ±[180°, 360°]. In particular, min(|Δϕmin|, |Δϕmax|)≥30° or min(|Δϕmin|, |Δϕmax|)≥60° can be used, with the function min(a, b) returning a, if a<b, and otherwise returning b.

The retardation ρ may in exceptional cases be equal to n*90° (with n being an integer), i.e., g is zero, but in most cases a somewhat detuned retarder is used, i.e. |ε|<30°, in particular 1°<|ε|<30°.

Typically, when choosing the angle θ and said retardation ρ as above for good temperature compensation, the light components coupled into the two non-circular eigenmodes of the spun fiber have unequal intensities $I_1$ and $I_2$, with $I_1:I_2=0.01 \ldots 0.99$ or $1.01 \ldots 100$.

Advantageously, the current sensor is designed so that $$\left|\Sigma_{i:\text{ optical paths}}(y_i\Delta L_{g_i})\right| > \frac{\lambda^2}{\Delta\lambda}$$

for all possible combinations of $y_i$=2, 1, 0, 1, 2, wherein the index i labels the birefringent waveguide sections that the light passes between the above mentioned first linear polarizer and the detector assembly and $\Delta L_{g_i}$ is the differential modal group delay of the birefringent waveguide section i, with at least one waveguide section k being such that $$\left|y_k\Delta L_{g_k}\right| > \frac{\lambda^2}{\Delta\lambda}.$$

Examples for birefringent waveguide sections are the polarization-maintaining fiber section between two fiber splices, a birefringence phase modulator, and its polarization-maintaining fiber pigtails. Other embodiments are listed in the dependent claims, the claim combinations, as well as in the description below.

BRIEF DESCRIPTION OF THE DRAWINGS

The invention will be better understood and objects other than those set forth above will become apparent from the following detailed description thereof. Such description makes reference to the annexed drawings, wherein:

FIGS. 1a-1b show (a) an input end and (b) the definition of the spin pitch p of a highly-birefringent spun fiber;

FIGS. 2a-2b show first embodiments of a sensor having non-reciprocal phase modulation;

FIG. 11b shows the normalized scale factor vs. temperature for a temperature-compensated sensor (for polarimetric detection) with θ=0°, 90° and ε≈19° according to FIG. 11a;

DETAILED DESCRIPTION OF THE INVENTION

Definitions

Figure 3A:
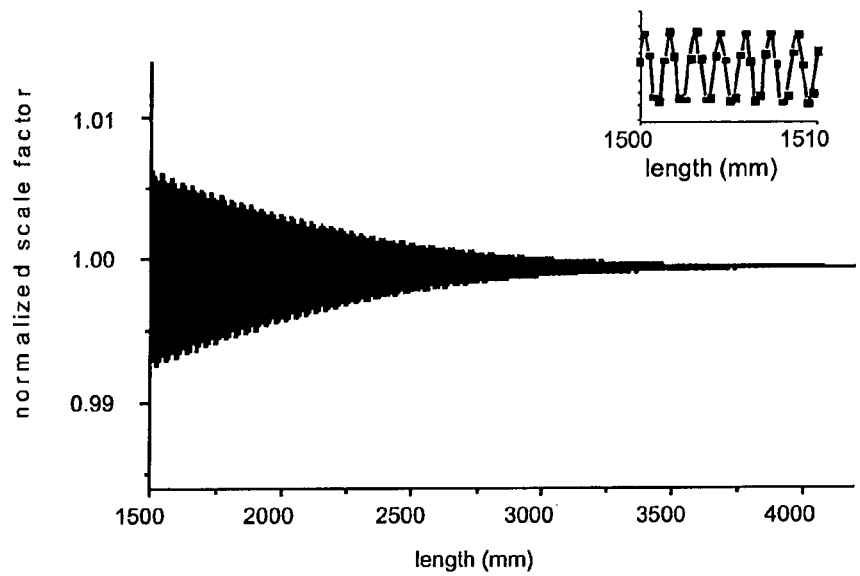
FIGS. 3a-3b show the normalized scale factor of a sensor with non-reciprocal phase modulation as a function of fiber length for a broadband light source with a spectral width (FWHM) of 40 nm (a) and 20 nm (b)—in this calculation, only the diameter of the sensing fiber coil is varied while the number of fiber windings remains constant (the inset of (a) shows a blow-up of the curve for spectral width of 40 nm revealing the oscillation period of half a pitch length, the fiber parameters are given in the detailed description)

In the context of the present disclosure a highly-birefringent spun fiber is defined as a fiber with embedded linear birefringence, characterized in the wavelength range of interest by an average linear beat length $\overline{L_{LB}} \leq 200$ mm, and that has been spun during the manufacturing process with a spin pitch p≤100 mm. The process freezes the twist permanently into the fiber. As a result the fiber becomes circularly birefringent.

An alternative method to generate circular birefringence is twisting a single-mode fiber along its longitudinal axis after manufacturing and holding the fiber in that position against an elastic untwisting force. The invention disclosure addresses the first type of fiber but may be adapted to the latter type, as well.

A "Faraday rotator" in the sense used herein is an optical component containing a magneto-optic material and a permanent magnet that induces a Faraday rotation of the polarization of linearly polarized light by a given non-zero angle, typically by an angle of at least 5°, e.g. 22.5°±10°, even in the absence of any additional external magnetic field. Hence, the sensing fiber is not a Faraday rotator in this sense, although it does exhibit a magnetic-field induced Faraday effect, because it only exhibits a Faraday rotation in the presence of an external magnetic field (i.e. the external magnetic field of the current conductor).

Highly-Birefringent Spun Fibers:

Highly-birefringent spun fibers are advantageously produced by spinning the preform of a linear birefringent fiber (e.g. a fiber with a bow-tie structure as depicted in FIG. 1(a)) during the drawing process so that the local principal axes of linear birefringence (slow and fast axes) rotate along the spun fiber. Linear birefringence means that the indices of refraction differ for linear polarization directions along the slow and fast axes Fs, Ff in FIG. 1(a), i.e. $n_{slow} - n_{fast} > 0$.

The fast and slow axes rotate along the fiber axis as depicted in FIG. 1(b). The spin pitch p is defined by the length over which the axes perform a full rotation.

FIG. 1a shows an angle θ, which is defined in the following sections by the angle between the slow axis Rs of a retarder located before the spun fiber and the slow axis Fs of the input end of the spun fiber. The angle θ is measured in the sense of the rotation of the spun fiber.

The linear birefringence of the unspun fiber is often given as linear beat length which is defined as $$L_{LB} = \frac{\lambda}{n_{slow} - n_{fast}}. \quad (1)$$

The corresponding birefringent phase shift per fiber length is $n_{LB} = 2\pi/L_{LB}$. Even though this parameter is not directly accessible from a measurement on the spun fiber, the linear beat length of a corresponding unspun, i.e. linearly birefringent, fiber is still used as a parameter to describe the spun fiber. The linear birefringent phase shift of a spun fiber is according to Eq. (1) wavelength-dependent, even if $n_{slow} - n_{fast}$ is independent of wavelength. Another important fiber parameter is the spin pitch or pitch length p=2π/α, where α is the number of radians per unit length by which the fiber is rotated during the drawing process. For current sensing applications, the spun fiber parameters should be chosen so that p<$L_{LB}$; otherwise the fiber rather behaves as a polarization maintaining (PM) fiber and gets largely insensitive to the Faraday effect. In the case of p<<$L_{LB}$, the spun fiber may lose its robustness against linear birefringence from external perturbation as discussed at the end of this paragraph. Both p and $L_{LB}$ are currently technically limited to values ≥1 mm, and typical ratios are $L_{LB}$/p=1 . . . 4. Furthermore, the fiber is described by its length l and the angle θ of the slow axis Fs of the spun fiber input end with respect to the slow axis Rs of the retarder (see FIG. 1a). The polarization evolution of monochromatic light injected into a straight spun fiber is fully described by these four parameters (in absence of a magnetic field) and can be calculated as described in Ref [15].

For each spun fiber system given by p, $L_{LB}$, l, and 0, there are two polarization states which are not altered by passing through the fiber. These states are denoted as eigenstates or eigenmodes. If $l=n\cdot p/2$, where n is an integer number, the eigenstates attain a simple form:

$$LCP^* \propto e^{-2i\theta}LCP+(x-\sqrt{x^2+1})RCP,$$

$$RCP^* \propto e^{-2i\theta}RCP-(x-\sqrt{x^2+1})LCP \quad (2)$$

where LCP (or RCP) denote the left (or right) circular polarization state and $x=2\cdot L_{LB}/p \gg 1$ is the ratio of linear beat length to spin pitch. The two eigenstates are essentially left or right circularly polarized and are accordingly written as LCP* (or RCP*). The dependence of the phase $e^{2i\theta}$ on the angular alignment is crucial for the disclosed invention. Contrary to a PM fiber, i.e. a linear birefringent fiber, which has linearly polarized eigenmodes, the eigenmodes of the spun fiber are close to circularly polarized. Accordingly, a spun fiber is often denoted to be circularly birefringent. In a more strict nomenclature, the birefringence of a spun fiber is called elliptically birefringent. The states LCP* and RCP* are for a reasonable choice of parameters close to circularly polarized states and accordingly acquire a relative phase shift in the presence of a magnetic field along the fiber as a result of the Faraday effect. Note that a magnetic field mainly changes the relative phase, i.e. the eigenvalues, of the spun fiber system, but leaves the eigenmodes largely unaffected.

The main motivation to use highly birefringent spun fibers is the robustness of the polarization evolution against mechanical perturbations of the fiber. In the following, the linear beatlength resulting from external perturbations (particularly from bending the fiber to a coil) is denoted as $L_{LB}^{ext}$. Intuitively, one could expect that the robustness of the spun fiber is solely given by the linear beatlength, i.e. the polarization evolution in the spun fiber is unaffected by external perturbations if $L_{LB} \ll L_{LB}^{ext}$. However, the actual (elliptical) birefringence in the spun fiber is as well a function of the pitch length and can be deduced from the eigenvalues corresponding to the eigenstates in Eq. (2). For $p < L_{LB}$ the resulting elliptical beatlength $L_{EB}$ can be approximated as:

$$L_{EB} \approx \frac{4L_{LB}^2}{p} \quad (3)$$

Numerical calculations including the external linear birefringence reveal that for $L_{EB} \ll L_{LB}^{ext}$ the polarization evolution is unaffected by the mechanical perturbation. For a wide range of sensor parameters (operating wavelength, sensing coil diameter, and fiber diameter), this condition is well fulfilled. In case of small fiber coil diameters (<10 cm) the scale factor may be affected by the bend-induced linear birefringence $\delta_b \propto r^2/(\lambda R)$ with r being the radius of the optical fiber and R being the radius of the fiber coil. The temperature dependence of the bend-induced birefringence $$\left(\frac{d\delta_b}{\delta_b dT} = 10^{-4} \ldots 10^{-3}/°C\right)$$

then results in a further temperature dependent contribution to the sensor signal. This contribution is not explicitly considered in the calculations given below. However, if needed it can be compensated in the same way as the other contributions that are considered in the following by a proper adjustment of the retarder.

Sensor with Non-Reciprocal Phase Modulation:

FIGS. 2a, 2b show reflective sensor configurations employing an actively modulated phase bias in a closed loop control scheme using non-reciprocal phase modulation[1, 2, 17]. The disclosed invention however equally applies to open loop control schemes [2] or to a variety of other possible modifications. The invention also applies to sensors employing passive polarimetric detection schemes. The embodiment of the disclosed invention in these cases is described further below.

The actively modulated sensor configuration of FIG. 2a is described as follows [1, 2]: The output from the broadband light source 10 is injected into the two eigenmodes of a PM fiber (=Polarization Maintaining fiber) 11, e.g. by means of a 45° splice 12 at the output of a linear polarizer (fiber polarizer) 13. A phase modulator 14, e.g. a $LiNbO_3$ phase modulator, generates a modulated differential phase shift between these two light waves.

In the case of prior art with a low-birefringent sensing fiber, the two linear light polarizations in the PM fiber are projected by a quarter-wave retarder (QWR) onto circular light polarization states in the sensing fiber. As discussed at the end of this paragraph, this retarder can be chosen to slightly deviate from perfect quarter-wave or 90° retardation by ε to account for temperature dependent effects. The two circularly polarized states in the sensing fiber acquire a relative phase shift proportional to the applied current I, the Verdet constant V of the sensing fiber, and the number of fiber turns or loops N of the coil 19 formed by the sensing fiber. This phase shift is denoted as non-reciprocal, which means that it is further accumulated on the return path after reflection and amounts in total to 4*N*V*I, briefly written as 4NVI.

The reflected circular light states are then projected onto the two linear polarization modes of the PM fiber by the quarter-wave retarder, where the wave packet aligned along the slow (or fast) axis of the PM fiber on the incoming light path is now aligned with the fast (or slow) axis. In other words: With HLP and VLP denoting the two linear polarizations in the PM fiber and RCP and LCP the right and left handed circular light polarizations, the evolution of light polarization can be described in the case of exact quarter-wave retardation as $$HLP(VLP) \xrightarrow{QWR} RCP(LCP) \xrightarrow{mirror} LCP(RCP) \xrightarrow{QWR} VLP(HLP).$$

(Herein, the polarizations evolve either according to the un-bracketed polarizations or alternatively according to the bracketed polarizations). The light power detected at the light detector 15 is a function of the relative phase shift between the orthogonal linearly polarized light waves that interfere at the fiber polarizer 13. In case of an ideal sensor, i.e. a sensor with a sensing fiber free of linear birefringence and a retarder with perfect quarter-wave retardation, the retrieved magneto-optic phase shift $\Delta\phi$ is equal to the ideal phase shift 4NVI. The normalized scale factor, defined as $\Delta\phi/(4NV_0 I)$ is then equal to unity at the reference temperature used to define $V_0$. If the retardance deviates from 90° by ε, the scale factor shows a close to parabolic dependence on ε (approximately proportional to 1/cos ε). The quantity ε is temperature-dependent and is in prior art [2, 5, 17] adjusted so that the resulting temperature dependence of the scale factor $$\sim \frac{d\epsilon}{dT}\sin\epsilon/\cos^2\epsilon$$

compensates the scale factor variation due to the temperature dependence of the Verdet constant V. In the case of a highly-birefringent spun fiber as sensing fiber 17, as shown in FIG. 2a, the light from PM fiber 11 also passes a retarder 16 and enters into sensing fiber 17, at the end of which a reflector 18 is located. Sensing fiber 17 is wound into a coil 19 of N turns or loops around a current conductor 20 carrying the current I, with N being an integer number. The light is reflected by reflector 18, returns back through sensing fiber 17, retarder 16, PM fiber 11, phase modulator 14, splice 12 and polarizer 13 and arrives at light detector 15, where its intensity is measured.

The circular or close to circular polarization light states injected in the spun sensing fiber 17 do not generally coincide with the as well close to circular eigenstates of the spun fiber given in Eq. (2). Accordingly, in general, the two injected light waves are each split into the eigenmodes of the spun sensing fiber 17. Those light states get reflected at the reflector 18 and travel in backward direction along the fiber. The retarder again converts them to sets of orthogonal linearly polarized waves. The interference between these different states at polarizer 13 determines the signal at light detector 15. This signal is analyzed by a control unit 21. In case of closed-loop control, control unit 21 uses the signal to generate a feedback to the phase modulator 14. The feedback is superimposed on a square wave modulation with a frequency that is determined by roundtrip time of the light waves in the optical circuit as explained in [10] for the case of fiber gyroscopes. The feedback signal compensates the current-induced phase shift of the light waves, i.e. their phase shift when they interfere at the polarizer is zero. The sensor output is derived from the feedback signal.

In case of open-loop operation the current-induced phase shift is usually derived from the $1^{st}$ and $2^{nd}$ harmonics of the modulation frequency in the detector signal [2, 10]. The embodiment of FIG. 2b differs from the embodiment of FIG. 2a in the type of modulator and the way how the orthogonal linearly polarized light waves are generated [17]. The embodiment uses a Y-type $LiNbO_3$ modulator 31 as used in fiber gyroscopes. Preferably, the waveguides are generated by proton exchange. The modulator then also acts as a polarizer, i.e. incorporates polarizer 13 shown in FIG. 2a The two light waves are combined by a polarization maintaining fiber coupler 33. A 90°-offset 32 in the orientation of the principal fiber axes in one of the two fiber branches between the modulator and the coupler is to combine the two light waves emerging with parallel polarizations from the modulator to light waves with orthogonal polarizations in PM fiber 11. Further details are given in [17] and are herewith enclosed in their entirety in the description by reference. Alternatively, the modulator waveguides may be generated by Ti in-diffusion. In this case, modulator 31 is not polarizing and, as in FIG. 2a, an extra polarizer (not shown in FIG. 2b) is needed before the modulator. Further embodiments of this sensor scheme are disclosed in [19] and are herewith enclosed in their entirety in the description by reference.

The scale factor of the sensor configurations in FIG. 2a and FIG. 2b is generally influenced by the linear beat length $L_{LB}$ of spun sensing fiber 17, the spin pitch p, the retardation of the retarder 16, the orientation angle θ of spun sensing fiber 17 (i.e. spun sensing fiber input) with respect to the retarder 16, the length l of spun sensing fiber 17, and the spectrum of light source 10. These dependencies are further elucidated in the following.

(Note: The calculations that are shown in this document are conducted by means of the Jones calculus [16], in which each optical element is represented by a 2×2 matrix. For numerical analysis, the following parameters are purely exemplarily chosen, if not stated otherwise: V=0.992×10$^{-6}$ rad/A, dV/VdT=0.7×10$^{-4}$/° C., N=8, $L_{LB}$=11.7 mm, $dL_{LB}/L_{LB}dT$=4×10$^{-4}$ PC, p=2.9 mm, dε/εdT=2.2×10$^{-4}$/° C.).

Figure 3B:
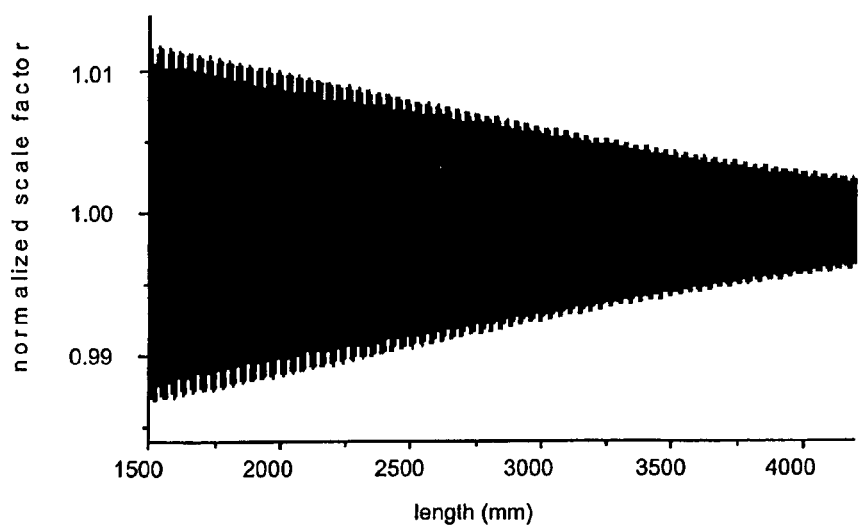

FIG. 3 shows the normalized scale factor of the sensor configurations of FIG. 2 (i.e. FIG. 2a, 2b) as a function of sensing fiber length for the stated parameter set and for two different widths of the broadband light spectrum (with Gaussian shape, see FIGS. 3a and 3b, respectively). This calculation reveals that the scale factor oscillates with a period of half the pitch length. This is a manifestation of interference between light waves propagating in the two different eigenmodes of the spun fiber. (If the length of the spun fiber is a multiple of half the spin pitch, all light waves propagating in the slow (or fast) mode in the incoming light direction are returning after reflection in the fast (or slow) mode and hence, in absence of an applied electrical current, all light states recover their initial relative phase. However, if the fiber length is arbitrary, some fraction of the light propagates in both directions in the same mode of the spun fiber. Interference between this un-swapped light waves is responsible for the fringes in FIG. 3a and FIG. 3b.

The coherence of the light waves propagating in the two different eigenmodes of the spun fiber decreases with increasing propagation distance, i.e. with increasing differential group delay between the two light waves. Hence, as shown in FIG. 3a, 3b, the amplitude of the observed oscillations decreases with sensing fiber length and becomes negligible when the delay between the eigenstates in the sensing fiber becomes much larger than the coherence time of the utilized light. The coherence length itself is inversely proportional to the width Δλ of the spectrum of the light source 10. When using a light source with a width (full width at half maximum) of 40 nm (such light sources are already commonly employed in prior art to reduce the influence of any unwanted interference effects) and a spun sensing fiber with reasonable parameters for pitch and linear beatlength, a length of a few meters is sufficient to completely suppress the oscillations. This condition can be mathematically expressed as $$\frac{l\Delta\lambda}{\bar{x}\bar{L_{LB}}\lambda} \gg 1$$

where λ is the center wavelength of light source 10, and Δλ the spectral full width at half maximum of the light from light source 10 (where $L_{LB}$ and $\bar{x}$ denote the wavelength average of the linear beat length and of the spin ratio). Correspondingly, in most cases the sensing fiber length l can be chosen so that an impractical determination of the fiber length with sub-millimeter accuracy is not needed. The mathematical expressions given in this document are all derived under the assumption that the condition $$\frac{l\Delta\lambda}{\bar{x}\bar{L_{LB}}\lambda} \gg 1$$

is well fulfilled.

If the sensor signal still shows residual oscillations with temperature, e.g. with amplitude of up to 0.2%, the mathematical expressions derived in the following still represent acceptable estimates as long as a temperature-smoothed signal is considered. Accordingly, we define a temperature-smoothed normalized scale factor SF'(T) that is derived by applying a low pass filter with a cut-off at 1/(20° C.) to SF(T). In other words, the temperature-smoothed normalized scale factor SF' is defined as an average of a nonaveraged normalized scale factor SF.

Figure 4:
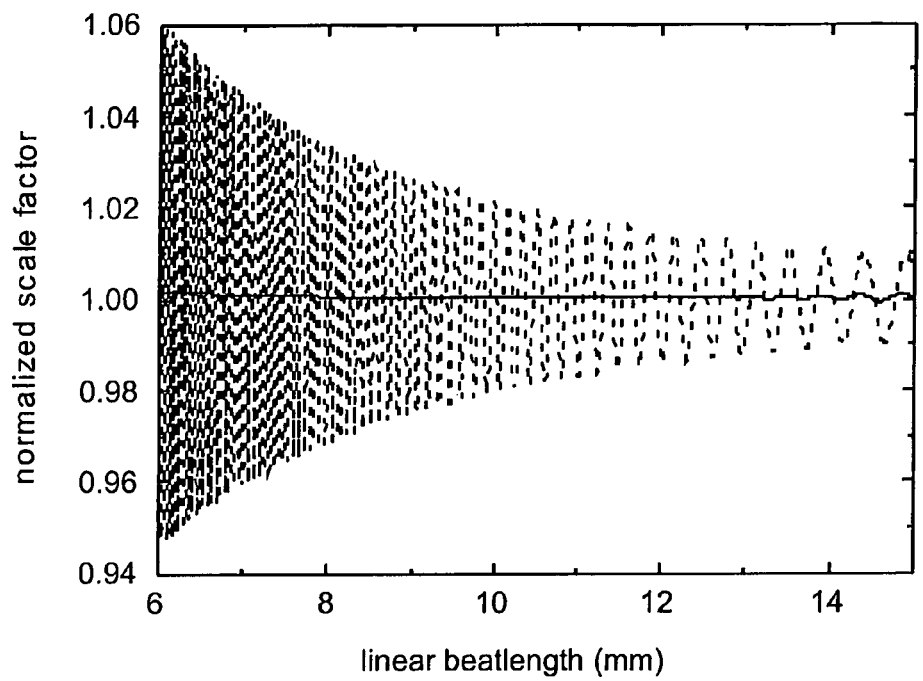
FIG. 4 shows the normalized scale factor of a sensor with non-reciprocal phase modulation as a function of the linear beatlength in the case of monochromatic light source (dashed curve) and a broadband light source (40 nm FHWM, solid curve) for θ=−45° (the fiber parameters are given in the detailed description)

FIG. 4 shows the scale factor as a function of the linear beat length for a monochromatic light source as well as for a light source with a width of 40 nm (FWHM). In the case of monochromatic light, the scale factor oscillates strongly with the beat length. Since the beat length of the fiber is temperature-dependent, these oscillations would obstruct an accurate current measurement. By using a fiber of sufficient length and a broadband light source, these oscillations are completely suppressed and the scale factor for $\varepsilon=0$ is nearly independent of the beat length. The suppression of the oscillations results from the fact that the different modes causing the oscillations become incoherent as a result of the group delay in the spun sensing fiber.

Figure 5:
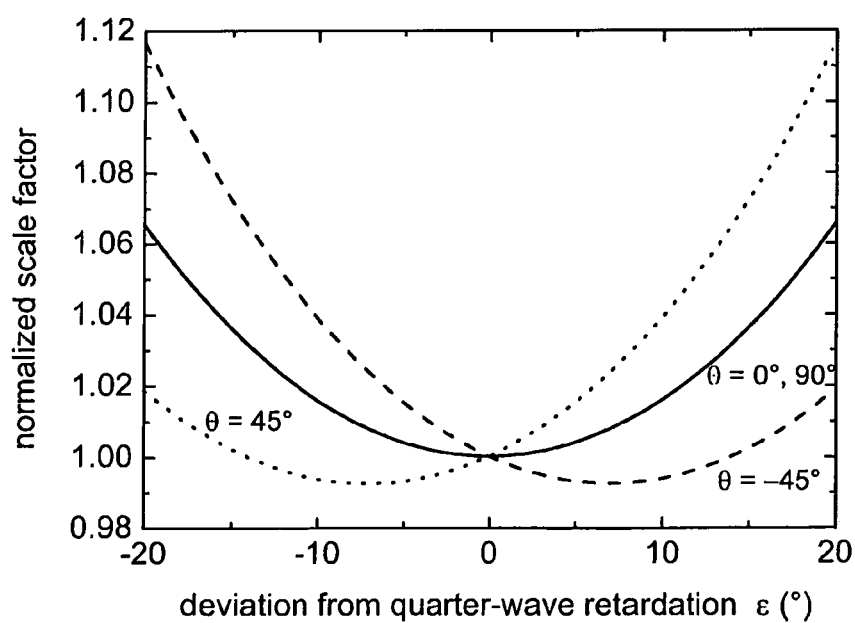
FIG. 5 shows the normalized scale factor of a sensor with non-reciprocal phase modulation as a function of g, i.e. the deviation from exact quarter-wave retardation, for different angular orientations of the spun fiber with respect to the PM fiber axes (the fiber parameters are given in the detailed description): θ=−45° (dashed curve), θ=0°, 90° (solid curve), θ=45° (dotted curve)

Even if the length of the sensing fiber and the utilized light source are chosen so that the aforementioned oscillations of the scale factor are suppressed, the choice of $\theta$ still affects the scale factor at $\varepsilon \neq 0$ where the injected light states have a finite ellipticity and, hence, an angular orientation: FIG. 5 depicts the scale factor as a function of $\varepsilon$ for different $\theta$. In fact, it can be shown that for a broadband light source and sufficiently long spun sensing fiber the dependence of the scale factor at small magneto-optic phase shifts (4VNI<<1) can be approximated as $$SF' = \frac{V}{V_0} \frac{1}{\sqrt{1+(\sin 2\theta/\bar{x})^2} \cos(\varepsilon + \tan^{-1}[\sin 2\theta/\bar{x}])}. \quad (4)$$

(Note that the analytic results given here are only approximations. The scale factor calculations in the figures are, however, based on calculations without approximations.)

The temperature dependent quantities in this equation are $\varepsilon$, V and $$\bar{x} = \frac{2\overline{L_{LB}}}{p}$$

Figure 6A:
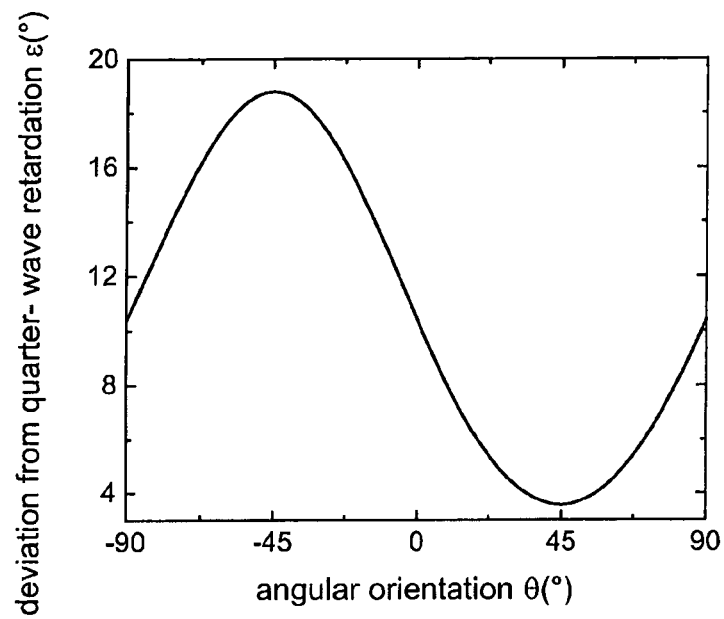
FIGS. 6a-6b show (a) the required deviation from perfect quarter-wave retardations as a function of the angular orientation of the spun fiber θ to achieve temperature compensation and (b) the normalized scale factor of a temperature compensated sensor as a function of temperature with θ=45° and ε≈4° according to (a)
Figure 6B:
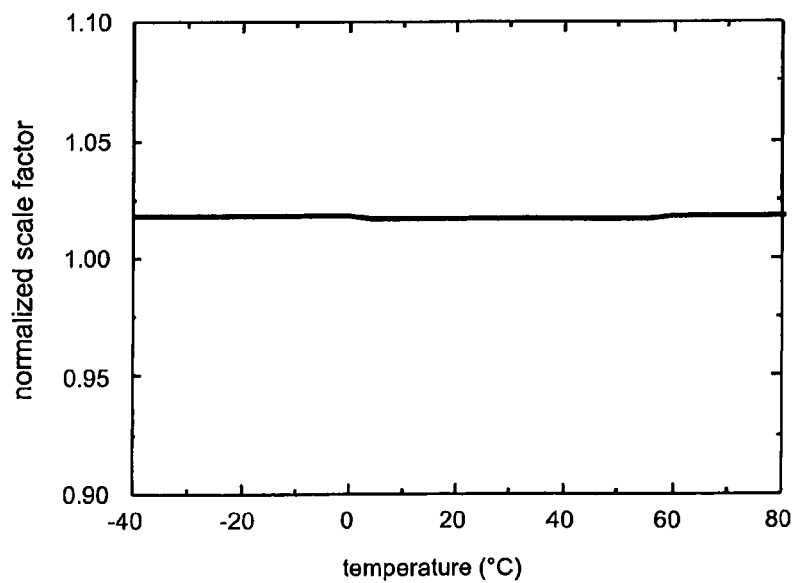

(i.e. $\bar{x}$ denotes the wavelength average of the linear beat length and of the spin ratio). The parameters $\varepsilon$ and $\theta$, however, can be chosen so that the scale factor becomes nearly independent of temperature. FIG. 6a depicts the proper choice of the retardance $\varepsilon$ as a function of the spun fiber orientation $\theta$ to achieve temperature compensation (e.g. $\varepsilon(\theta=45°) \approx 19°$, $\varepsilon(\theta=0, 90°) \approx 10°$, and $\varepsilon(\theta=45°) \approx 4°$). With a corresponding choice of retardance a current measurement that is insensitive to temperature within 0.1% can be conducted over a wide temperature range (see FIG. 6b).

In the following, special choices of $\theta$ are discussed in more detail, which further elucidates the dependence of the scale factor on $\theta$ and $\varepsilon$. In the case of $\theta=-45°$ and $\theta=-45°$, Eq. (4) becomes:

$$SF'_{\theta=\pm 45°} = \frac{V}{V_0} \frac{1}{\sqrt{1+\bar{x}^{-2}} \cos(\varepsilon \pm \cot^{-1}\bar{x})}$$

For $\varepsilon=\mp\cot^{-1}\bar{x}$, the eigenmodes of the PM fiber are each projected onto the eigenstates of the spun sensing fiber.

Note: With the two eigenmodes of the PM fiber denoted as HLP and VLP, the evolution of light polarization is in this case as follows $$HLP(VLP) \xrightarrow{QWR} RCP^*(LCP^*) \xrightarrow{mirror} LCP^*(RCP^*) \xrightarrow{QWR} VLP'(HLP').$$

The returning polarizations VLP' (HLP') include components with un-swapped polarization since the round-trip retardation of the retarder amounts to $180°\mp2\cot^{-1}\bar{x}$ and correspondingly differs from exact half-wave retardation that yields a rotation by 90° (HLP (VLP)→VLP(HLP)). The configuration $\varepsilon=\mp\cot^{-1}\bar{x}$ corresponds to a sensor employing a low-birefringent sensing fiber with $\varepsilon=0$ and an effective Verdet constant reduced by a factor of $1/\sqrt{1+\bar{x}^{-2}}$ (see above). In all other cases (with the quarter-wave retarder oriented with ±45° to the PM fiber), each of the two linear polarized light states in the PM fiber is projected onto a superposition of the eigenstates of the spun sensing fiber. With $\theta=0°, 90°$, the superposition contains both eigenstates to equal amounts and, in the overall sensor performance, all specifics of the spun sensing fiber are averaged out; Eq. (4) becomes:

$$SF'_{\theta=0°,90°} = \frac{V}{V_0} \frac{1}{\cos(\varepsilon)}.$$

This expression coincides with the expression for a low-birefringent fiber in absence of any residual linear birefringence. Accordingly, the choice of $\theta=0°, 90°$ enables the design of a temperature compensated current sensor without exact knowledge of the spun sensing fiber parameters and their temperature dependences. However, for $\theta=\pm 45°$, i.e. at the extrema of $\varepsilon(\theta)$, the proper choice of $\varepsilon$ is the least sensitive to slight deviations of $\theta$ from its nominal value (see FIG. 6a).

Hence, in an advantageous embodiment angle $\theta$ is equal to 0±10°, 45°±10° or 90°±10°, in particular 0±5°, 45°±5° or 90°±5°.

The choice of these parameters also significantly impacts the current non-linearity of the detected signal, which is discussed in the following section.

Sensor Configuration with Minimized Current Non-Linearity

As already discussed in the previous section, the evolution of the different light states in the sensing fiber is generally very complex and the linear current-phase shift relation given in the previous section is in most cases only an approximation.

Figure 7A:
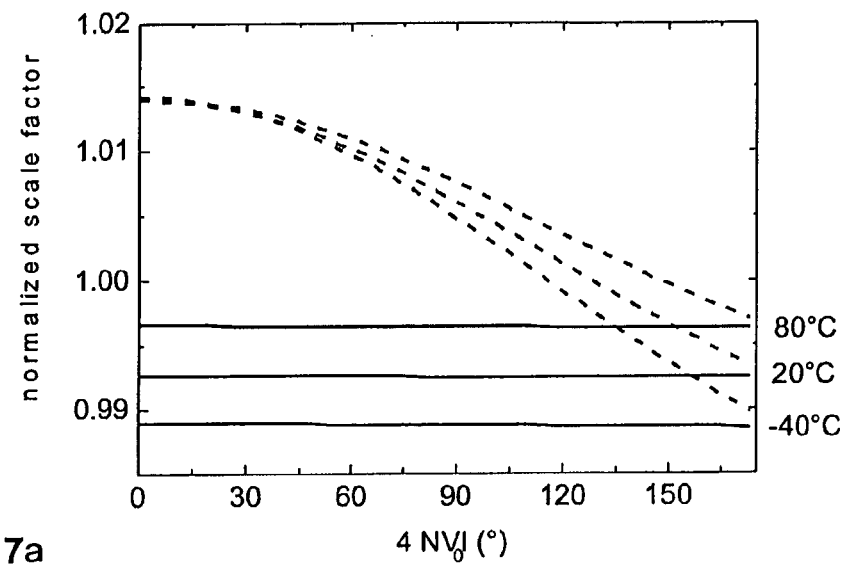
FIGS. 7a-7b show (a) the normalized scale factor of a sensor with non-reciprocal phase modulation as a function of magneto-optic phase shift for two different sensor configurations at −40° C., 20° C., and 80° C. The dashed lines correspond to a sensor with θ=0°, temperature-compensated for low phase shifts, and the solid lines to a sensor with θ=−45° and ε=cot⁻¹x̄; and (b) the normalized scale factor as a function of ε for a sensor with θ=0° (dashed line and dash-dotted line) and a sensor with θ=−45° (solid line and dotted line) and two different magneto-optic phase shifts (dashed and solid curve: Δϕ≈1°, dash-dotted and dotted curve: Δϕ≈80°) In both cases, the higher phase shift flattens the curve; however, only in the case of θ=±45°, ε can be chosen so that the scale factor is independent of the phase shift itself, e.g., for ε≈5° . . . 10° in the case of θ=−45°.

FIG. 7a (dashed lines) depicts the scale factor vs. the magneto-optic phase shift for the inherently temperature-compensated sensor configuration (see FIG. 6b) and three different temperatures. The inherent temperature compensation is effective at magneto-optic phase shifts $\Delta\phi \leq 45°$, but gradually becomes less effective as $\Delta\phi$ approaches 180° as a result of nonlinearity. The nonlinearity depends on $\varepsilon$ and thus varies with temperature as can be seen in FIG. 7a.

Note: In principle, ε can be also chosen such that perfect temperature compensation is achieved for example at Δϕ=90°. This may be preferred in cases where the rated current corresponds to phase shifts of this magnitude. In that case, the temperature compensation is only partial at small Δϕ. Hence, in more general terms and as mentioned under "Disclosure of the Invention" above, the current sensor is designed such that temperature compensation is achieved within a "nominal phase shift range" [Δϕ$_{min}$, Δϕ$_{max}$] with a width of at least 10°, in particular of at least 30°. This nominal phase shift range can be close to zero, e.g. [0°, 30°], or it can be in a range away from zero, i.e. min(|Δϕ$_{min}$|, |Δϕ$_{max}$|)≥30°, in particular min(|Δϕ$_{min}$|, |Δϕ$_{max}$|)≥60°.

Figure 7B:
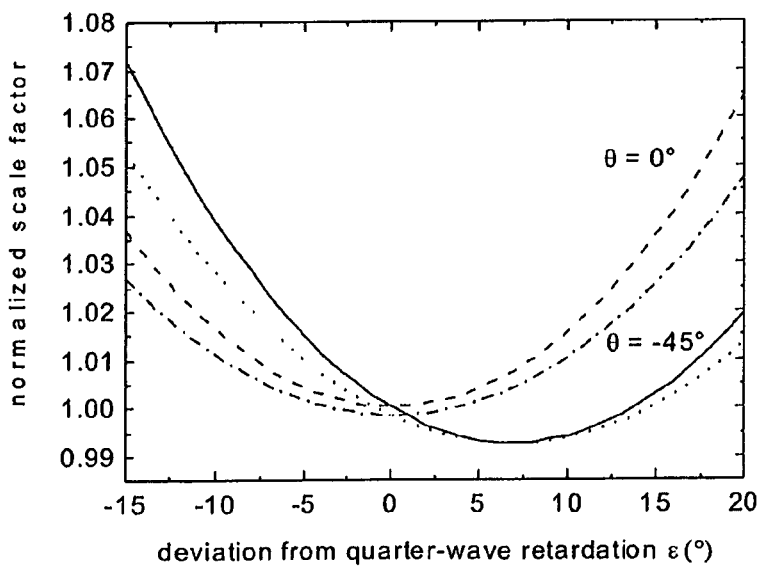

Also in the case of a low-birefringent sensing fiber, the scale factor itself varies with the phase shift for ε≠0, while for ε=0 the scale factor is independent of the magneto-optic phase shift (assuming that there is no bend-induced fiber birefringence) [17]. The equivalent behaviour is achieved in the case of a highly birefringent spun sensing fiber by injecting pure eigenstates of the sensing fiber (see above). To this end, the parameters of the disclosed sensor configuration are set to θ=±45° and ε=∓cot$^{-1}$ x̄ (±5°), and the current non-linearity of the detected phase shift largely vanishes (see FIG. 7a (solid lines) and FIG. 7b). This sensor configuration is preferred, if the rated current generates phase shifts so large that temperature compensation via the quarter wave retarder becomes difficult. In this case, the temperature compensation may be achieved by an independent temperature measurement and electronic signal correction.

Sensor with Polarimetric Detection:

In the embodiments of FIG. 2, non-reciprocal phase modulation has been used to detect the phase shift between the returning light waves. In this section, a sensor using polarimetric detection is described.

Figure 8:
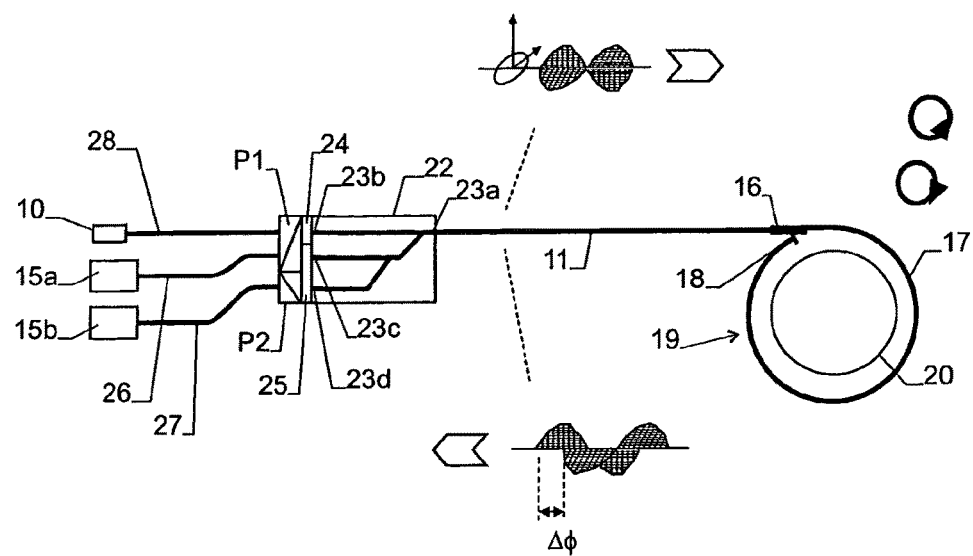
FIG. 8 shows a second embodiment of the sensor using polarimetric phase detection.

FIG. 8 shows a preferred configuration of this sensor type. Several others are illustrated in [11], the disclosure of which is herewith in its entirety incorporated in this application by reference. The depolarized light from a broad-band light source 10 is sent via a single-mode fiber 28 and a first polarizer P1 to a 3×1 integratedoptic beam splitter module 22. Beam splitter module 22 has a first, second, third and fourth port 23a, 23b, 23c, 23d. Light entering from first port 23a is split and distributed to second, third and fourth port 23b, 23c, 23d. Light entering through second port 23b, exits through first port 23a. First port 23a and second port 23b are generally arranged between polarizer P1 and sensing fiber 17, such that light from polarizer P1 enters second port 23b and light from sensing fiber 17 enters first port 23a.

The detector assembly of the embodiment of FIG. 8 comprises a first light detector 15a and a second light detector 15b and first and second linear polarizers P1 and P2. First linear polarizer P1 is arranged between light source 10 and second port 23b as well as between third port 23c and first light detector 15a, and it is arranged under 45° in respect to the PM fiber 11. Second polarizer P2 is located between fourth port 23d and second light detector 15b and is arranged under −45°, i.e. the polarization axes of the polarizers P1 and P2 are mutually perpendicular.

A spacer glass plate 24 is arranged as a spacer between first polarizer P1 and second port 23b, and a quarter-wave retarder 25 is arranged between first polarizer P1 and third port 23c as well as between second polarizer P2 and fourth port 23d.

Polarizer P1 linearly polarizes the light before the light is coupled into second port 23b of splitter module 22. At the opposite end of the splitter, at first port 23a, the linearly polarized light is injected into the two linear eigenmodes of PM fiber 11. To this purpose, the fiber's principal fiber axes are aligned at 45° to the polarization direction of polarizer P1. A PM fiber retarder 16 converts the two orthogonal linearly polarized waves into circularly or near-circularly polarized light waves before the light enters into the highly birefringent spun sensing fiber 17. The light is reflected at the far end of the spun sensing fiber at a reflector 18, runs back through sensing fiber 17 and is converted back to orthogonal linearly polarized light waves when it passes retarder 16 for the second time. The polarization states of the returning linearly polarized waves are swapped compared to the forward propagating waves. The light returning to third port 23c passes quarter-wave retarder 25 and again polarizer P1. The light returning to fourth port 23d passes the same quarter wave retarder 25 and polarizer P2. The principal retarder axes of quarter-wave retarder 25 are aligned parallel to the axes of PM fiber 11. Two single-mode fibers 26, 27 guide the light from the third and fourth ports 23c, 23d to the light detectors 15a, 15b which yield light intensities it turn to be evaluated by processing means (not shown) as described below when referring to equations (5) and (6).

Notes:

Advantageously the waveguides of the splitter module are of low birefringence in order not to introduce additional phase changes and not to change the polarization state of the light.

Advantageously the principal axes of PM fiber 11 are parallel and perpendicular to the normal of the chip of beam splitter module 22, i.e. polarizers P1 and P2 are at ±45° to the splitter normal.

In another advantageous orientation the principal axes of PM fiber 11 are at 45° to the normal of the chip of beam splitter module 22, i.e. polarizers P1 and P2 are at 0° and 90°, respectively, or at 90° and 0°, respectively, to the normal of the chip of beam splitter module 22.

Advantageously the light is depolarized by fiber depolarizers (not shown) after passing polarizers P1 and P2 on the return pass and before being coupled into single-mode fibers 26, 27.

For practical reasons (small spacing between ports) polarizer P1 is a common polarizer for the second and third ports 23b, 23c. Alternatively, two separate polarizers may be used. Similarly, quarter-wave retarder 25 is common for third and fourth ports 23c, 23d.

Again for practical reasons, an inactive quarter-wave retarder or, as mentioned, glass plate 24, acts as a spacer between second port 23b and polarizer P1. (An "inactive quarter-wave retarder" is a retarder with one of its principal axes parallel to the polarization direction of polarizer P1.)

The distance between the face of the integrated beam-splitter module and the single-mode fibers shall be small in order to minimize insertion losses. Therefore the polarizers P1 and P2 are preferably thin film polarizers and the quarter-wave-retarder is of 0$^{th}$ order.

Advantageously the depolarizers are Lyot type fiber depolarizers consisting of two sections of polarization maintaining fiber with their principle axes aligned at 45° to each other and a length ratio of the fiber sections of 2:1.

Instead of the single-mode fibers 26, 27 two multi-mode fibers may be used.

As an alternative to the above orientations, the axes of retarder 25 may be aligned at 45° to the axes of PM fiber 11, and the polarizers at ports 23c, 23d aligned at +45° and −45° to the fast axis of retarder 25.

The quarter-wave retarder 16 in FIG. 8 introduces a 90°-phase shift between the orthogonal returning waves.

The light power detected at the two photodiodes is in the case of a low-birefringent sensing fiber with no linear birefringence and with a 90°-fiber-retarder then given by $$S_{1,2} = S_0 (1 \pm \sin \Delta\phi). \quad (5)$$

Here, $S_0$ is the light intensity detected by the two photodetectors in the absence of applied electrical current. The quantity $\Delta\phi$ again denotes the magneto-optic phase shift which can accordingly be retrieved from the detected light powers as:

$$\Delta\phi = \sin^{-1} \frac{s_1 - s_2}{s_1 + s_2}. \quad (6)$$

Note: Since the optical circuit of the polarimetric detection schemes differs from the optical circuits of the actively modulated schemes, the retrieved magneto-optical phase shift $\Delta\phi$ at a given current I commonly differs for the different sensor embodiments (particularly, in cases with $\epsilon \neq 0$ and/or $\delta_b \neq 0$).

If the retarder deviates from 90° by an amount $\epsilon$, the normalized scale factor varies with $\sim\cos\epsilon$ at low currents. Due to the temperature dependence of the retardation, adjustment of $\epsilon$ enables inherent compensation of the temperature dependence of the Verdet constant similar to the sensor configuration employing an actively modulated detection scheme as described above. When employing a highly birefringent spun sensing fiber, the scale factor depends as well on the linear beat length, its temperature dependence, the spin pitch, the angular orientation of the spun sensing fiber (i.e. fiber input) with respect to the axes of the retarder, and the bend-induced birefringence. Moreover, for a given coherence length of the light source the lengths of the PM fiber sections and the spun sensing fiber are advantageously properly tailored for a stable signal. In the following we disclose, how inherent temperature compensation can be achieved for the sensor configuration in FIG. 8 employing a highly birefringent spun sensing fiber. Note: The term linear beat length again denotes the beat length a corresponding unspun fiber would have.

As in the case of the modulator configuration above, the pronounced oscillations of the scale factor as a function of fiber length and linear beat length can be suppressed by choosing a broadband light source and a fiber with sufficient length to achieve the demanded accuracy. The scale factor oscillates again as a function of spun sensing fiber length with a period given by half of the spin pitch. The amplitude of these oscillations decreases with sensing fiber length as in the case of the modulator setup and can accordingly be suppressed down to the demanded accuracy by choosing the proper sensing fiber length. However, further calculations reveal that length dependent changes of the scale factor persist over a longer sensing fiber length than in the case of a sensor with active phase modulation. Correspondingly, we choose for the following calculations a sensor head configuration with N=16 fiber windings instead of 8 windings as above (in both cases a sensing coil diameter of 170 mm is used at which bend-induced birefringence can be completely neglected for typical spun sensing fiber parameters). Apart from that, all parameters are the same as above. Still, all claimed features of this sensor configuration can also be realized in the case of a shorter sensing fiber, but the exact results for the scale factor etc. might be slightly dependent on fiber length.

In the case of finite cross coupling between the two eigenmodes of the PM fiber section between quarter-wave retarder and splitter, disturbing interference effects can occur. These effects can efficiently be reduced by appropriate choice of the length of PM fiber 11.

Figure 9:
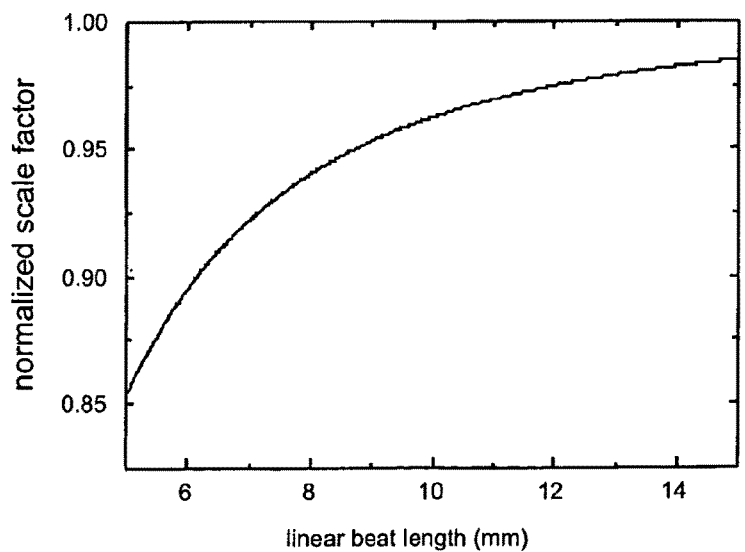
FIG. 9 shows the normalized scale factor as a function of linear beat length for polarimetric detection with broadband light (FWHM=40 nm) and θ=0°, 90° and ε=0 (the fiber parameters are given in the detailed description)

FIG. 9 depicts the scale factor of the sensor configuration of FIG. 8 for a certain parameter set as a function of the linear beat length. A significant decrease of the scale factor is observed towards small beat lengths contrary to the corresponding sensors with active phase modulation.

It can be shown that the scale factor at low currents and with a sufficiently long spun sensing fiber and $\theta = \pm 45°$ is given by $$SF'_{\theta = \pm 45°} = \frac{V}{V_0} \frac{\cos(\epsilon \pm \cot^{-1} \bar{x})}{\left(\sqrt{1 + \bar{x}^{-2}}\right)^3}, \quad (7)$$

while the corresponding expression for reads for $\theta = 0°, 90°$ reads $$SF'_{\theta = 0°, 90°} = \frac{V}{V_0} \frac{\cos\epsilon}{\left(\sqrt{1 + \bar{x}^{-2}}\right)^4}. \quad (8)$$

Figure 10:
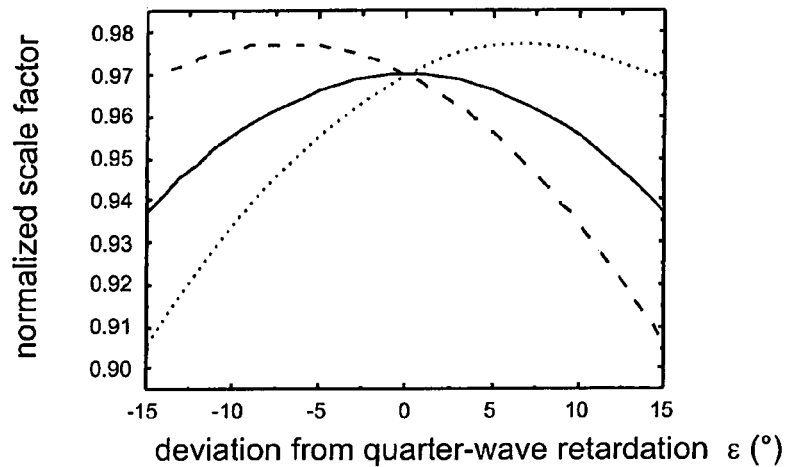
FIG. 10 shows the normalized scale factor for polarimetric detection as a function of ε for θ=−45° (dashed line), θ=0°, 90° (solid line), and θ=−45° (dotted line)
Figure 11A:
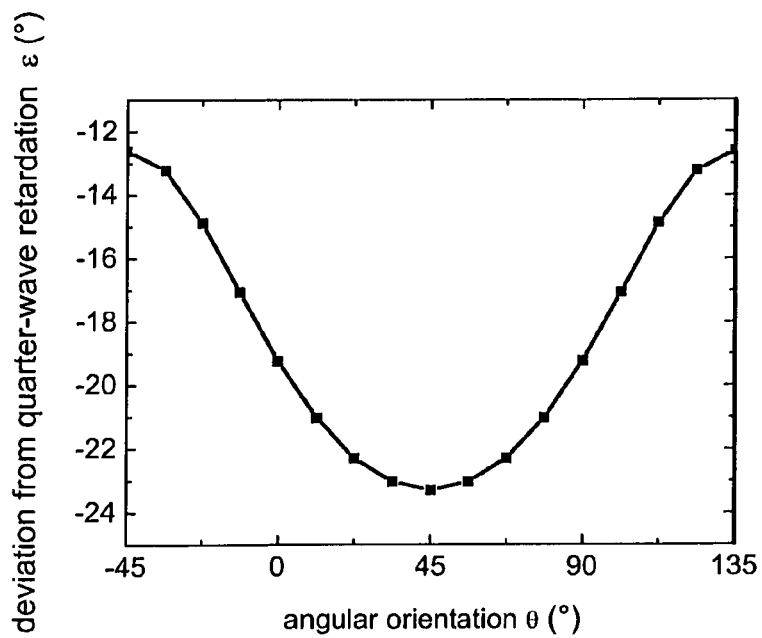
FIG. 11a shows the optimum choice of ε(θ) to achieve temperature compensation (polarimetric detection)
Figure 11B:
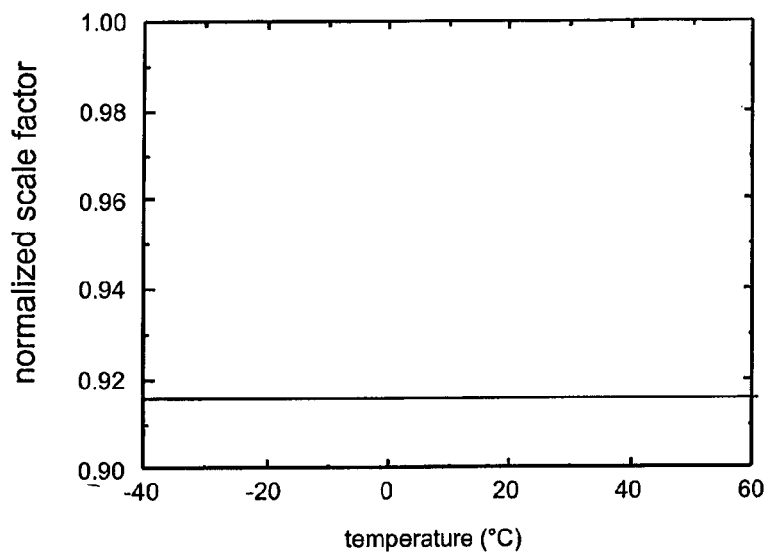

Herein, $\bar{x} = 2\overline{L_{LB}}/p$ denotes the wavelength averaged ratio of linear beatlength to spin pitch. Please note that for $\epsilon = 0$ the expressions for Eqs. (7) and (8) coincide. Furthermore, FIG. 10 depicts the scale factor as a function of $\epsilon$ for different angular orientations of the spun sensing fiber with respect to the axes of the PM fiber. Those dependencies can be understood analogously to the discussion for the active phase modulation sensor configuration above. At $\epsilon = 0$, the scale factor is nearly independent of the angular orientation, if the spun sensing fiber is sufficiently long and therefore three curves cross at $\epsilon = 0$. Contrary to the case of the active modulation, the scale factor depends for all choices of $\theta$ on the spun sensing fiber parameters (see Eqs. (7) and (8)) including the beat length. Accordingly, temperature compensation of the sensor requires in all cases not only to compensate the temperature dependence of the Verdet constant but also the one of $\overline{L_{LB}}$. Again this is done by an appropriate choice of the retarder parameters. For all sets of spun sensing fiber parameters, $\epsilon$ can be chosen so that the scale factor becomes independent of temperature. FIG. 11a depicts the proper choice of $\epsilon(\theta)$ to achieve temperature compensation for the example parameter set while FIG. 11b shows the scale factor vs. temperature of a corresponding sensor with $\theta = 0°, 90°$ and $\epsilon \approx -19°$. It is obvious that the scale factor is essentially independent of temperature.

Sensor with Polarimetric Detection and Faraday Rotator:

Alternative configurations to the embodiment of FIG. 8 use a Faraday rotator to introduce the necessary phase bias to optimize the sensor's response to current. As in the previous case, the temperature dependence of an additional retarder is used to compensate the temperature dependence of the spun sensing fiber. Again, as in the previously disclosed sensor configurations employing a spun sensing fiber, the spun sensing fiber has to be chosen long enough for the given width of the utilized light source so that the scale factor oscillations with beat length are within the demanded accuracy limit.

Figure 12:
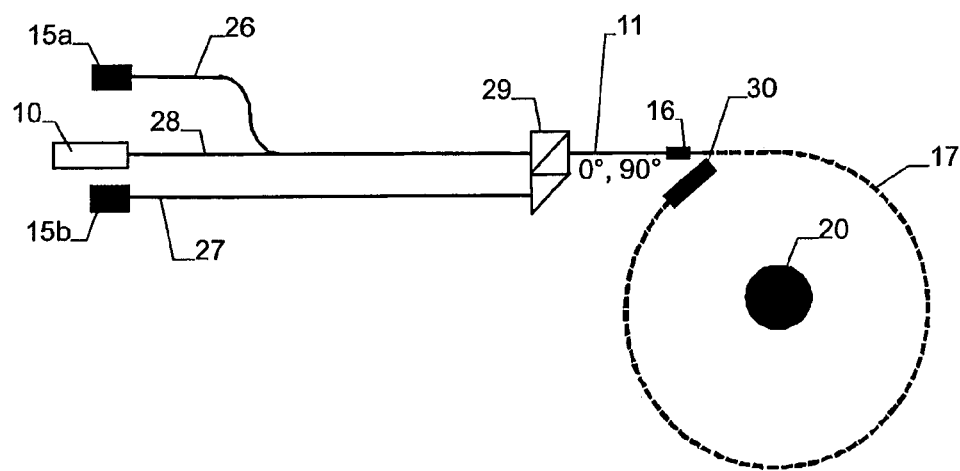
FIG. 12 shows a third embodiment of the sensor using a Faraday rotator and polarimetric phase detection having a PM fiber oriented at 0°/90°.

FIG. 12 depicts the setup of the disclosed configuration. Light is generated by a light source 10, polarized by a polarizing beam splitter 29 (which acts as "first polarizer" in the sense of the claims) and injected into one eigenmode of a PM fiber 11, i.e. PM fiber 11 is at a 0° or 90° orientation in respect to the polarization direction of polarizing beam splitter 29. The light from PM fiber 11, which is linearly polarized, enters a (detuned) half wave retarder 16, wherein the light entering the retarder 16 from PM fiber 11 is polarized at 45° to the main axes of the retarder. It passes retarder 16 and is coupled into highly-birefringent spun sensing fiber 17. The light then passes a Faraday rotation mirror 30 that has a single-pass phase shift of 45°, corresponding to a single pass rotation angle of $\alpha=22.5°$. From the mirror 30, the light passes back through sensing fiber 17, retarder 16 and PM fiber 11. At polarizing beam splitter 29 the light is split into two orthogonal polarizations, which are sent to a first light detector 15a and a second light detector 15b, respectively.

In the case of a low-birefringent sensing fiber, the linearly polarized light in the sensing fiber acquires a Faraday rotation (including the contribution of the mirror) of $2NVI+45°=\Delta\phi/2+45°$ where $\Delta\phi=4NVI$ denotes the magneto-optical phase shift. The polarizing beam splitter projects the returning rotated light onto the two orthogonal linear polarization states whose light power is measured by the two light detectors 15a, 15b. If the retarder is set to exact half-wave retardation, the signal at the light detectors is given by $$S_{1,2}=S_0(1\pm\sin\Delta\phi). \qquad (9)$$

As in the previous embodiments as described above when referring to equations (5) and (6), the magneto-optic phase shift $\Delta\phi=4NVI$ can accordingly be retrieved from the detected light power signals as:

$$\Delta\phi = \sin^{-1}\frac{s_1 - s_2}{s_1 + s_2}. \qquad (10)$$

The optimum angle bias by the rotation mirror is $2\alpha=45°$ as achieved by a 22.5° rotation mirror (single pass). Nevertheless, due to the temperature dependence of the rotation mirror, the angle bias is generally a function of temperature $\alpha(T)$.

When using a highly-birefringent spun fiber as sensing fiber 17, the scale factor is affected by the choice of $\theta$. For $\theta=\pm 45°$ the scale factor at small currents is given by $$SF'_{\theta=\pm 45}(\epsilon = 0) = \frac{V}{V_0}\frac{1}{(1+\bar{x}^{-2})^2}, \qquad (11)$$

while the corresponding expression for $\theta=0°, 90°$ reads $$SF'_{\theta=0°,90°}(\epsilon = 0) = \frac{V}{V_0}\frac{1}{1+\bar{x}^{-2}}. \qquad (12)$$

Figure 13:
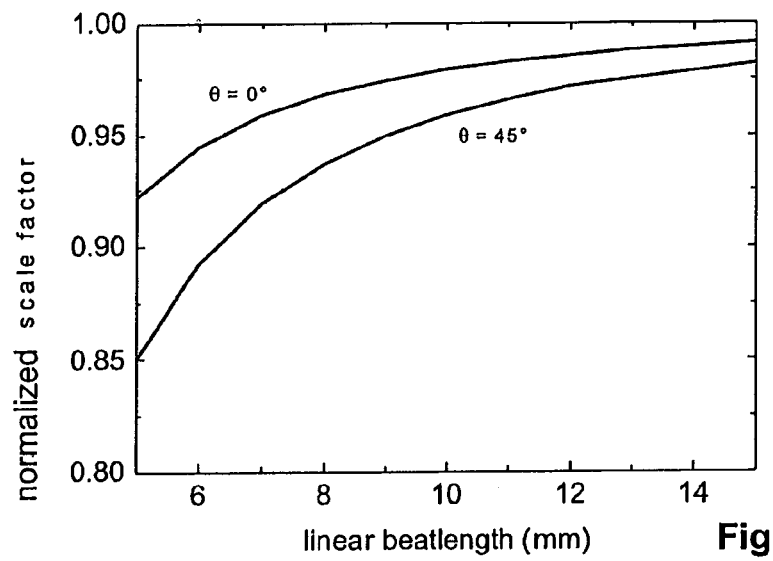
FIG. 13 shows the normalized scale factor for a sensor according to FIG. 12 as a function of linear beat length for different angular orientations of the spun fiber of the embodiment of FIG. 12.

Correspondingly, setting $\theta$ to 0°, 90° is again preferred since this way the dependence of the scale factor on the temperature-dependent beat length of the spun sensing fiber is significantly reduced (see FIG. 13). Still, the overall temperature dependence of the scale factor of this sensor configuration comprises several contributions from the individual components that, without a retarder 16, could not be adjusted to inherently compensate each other: the second order temperature dependence due to the Faraday rotation mirror, the linear change of the scale factor due to the change of the Verdet constant with temperature, and the, nevertheless minimized, change of the scale factor due to the change of the beat length of the spun sensing fiber with temperature. These temperature dependent changes of the scale factor could be compensated during signal processing by extracting the temperature, e.g. from the measurement of the DC offset. In another embodiment, a slightly detuned half-wave retarder 16 at the splice between PM fiber 11 and highly-birefringent spun sensing fiber 17 is used to compensate such temperature dependencies. Retarder 16 represents an additional temperature-dependent component whose retardance can be adjusted to compensate the temperature dependence stemming from the change of the Verdet constant and the beat length of the spun sensing fiber. Regarding a minimized dependence of the scale factor on the beat length, a configuration with $\theta=0°, 90°$ is preferred. The retardance needs to be set to slightly smaller values than 180° to achieve temperature compensation for $\theta=0°, 90°$. For $\theta=+45°$ the corresponding values for the retardation are shifted by $\pm\cot^{-1}\bar{x}$ as in the case of the previously sensor configurations employing spun sensing fiber.

Figure 14:
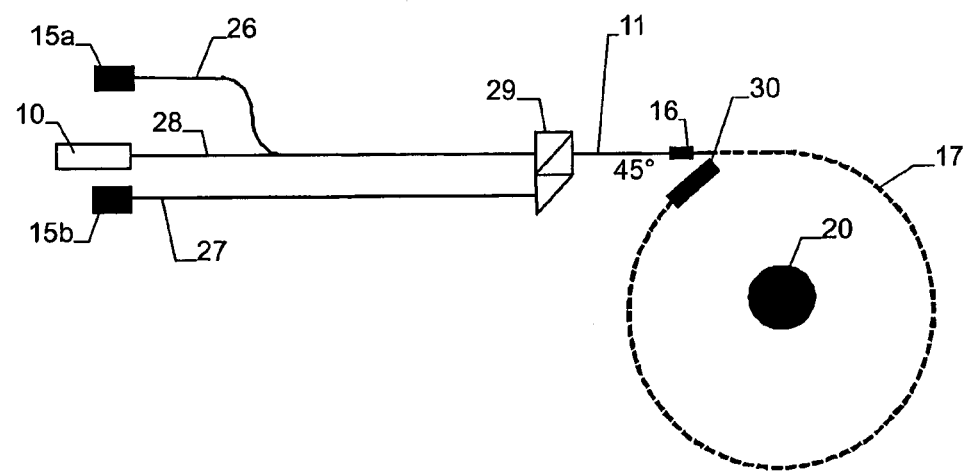
FIG. 14 shows a fourth embodiment of the sensor using a Faraday rotator and polarimetric phase detection having a PM fiber oriented at 45°.

The angle between the main axes of PM fiber 11 and the main axes of retarder 16 in the embodiment of FIG. 14 is 45°, i.e. the angle between the polarization direction of the light exiting polarizing beam splitter 29 in the direction of sensing fiber 17 and the main axes of retarder 16 is 0° and 90°, respectively.

In the following, we disclose further sensor configurations employing a Faraday rotation mirror. The main difference to the previous configuration (FIG. 12) results from the fact that PM fiber 11 is oriented with 45° with respect to the axes of the polarizing beam splitter, as shown in FIG. 14. Correspondingly, light is injected in the two eigenmodes of the PM fiber section 11 and a quarter-wave retarder 16 is used to project the linearly polarized states onto two orthogonal and in general elliptical light states in the spun sensing fiber 17. The quarter-wave retarder 16 is again adjusted so that its temperature dependence balances the temperature dependence of the Verdet constant and other temperature dependent contributions resulting from using a highly-birefringent spun sensing fiber.

The scale factor can be derived as in the previous cases. For $\theta=\pm 45°$ the scale factor becomes approximately $$SF'_{\theta=\pm 45°} = \frac{V}{V_0}\frac{3+\cos(2\epsilon\pm 2\cot^{-1}\bar{x})}{4(1+\bar{x}^{-2})}, \qquad (13)$$

while the corresponding expression for $\theta=0°, 90°$ reads $$SF'_{\theta=0°,90°} = \frac{V}{V_0}\frac{1}{4(1+\bar{x}^{-2})}\left[2+\frac{1+\cos(2\epsilon)}{1+\bar{x}^{-2}}\right]. \qquad (14)$$

Figure 15A:
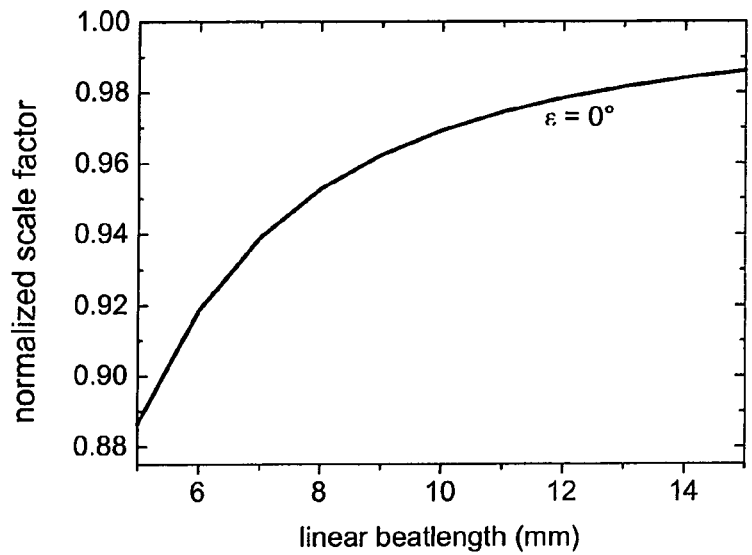
FIG. 15a shows the normalized scale factor as a function of linear beat length.
Figure 15B:
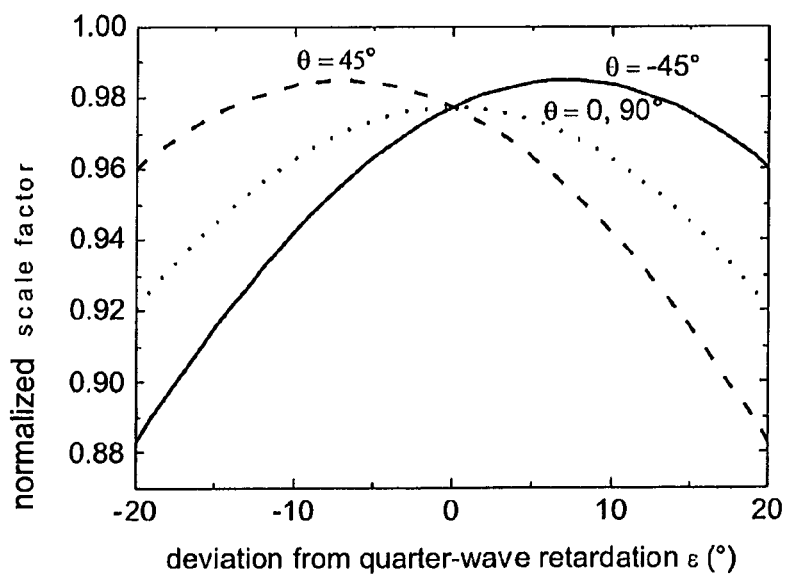
FIG. 15b shows the normalized scale factor as a function of deviation from quarter-wave retardation for different angular orientations of the spun fiber.

Please note that for $\epsilon=0$, Eqs. (13) and (14) coincide, The corresponding curves are depicted in FIGS. 15a and 15b. As in the earlier discussed configurations employing a quarter-wave retarder, $\epsilon$ can be adjusted in dependence on $\theta$ to achieve an inherent temperature compensation of the scale factor due to the temperature dependent contributions from the Verdet constant and the linear beat length.

Since the dependence of the scale factor on $\epsilon$ is given by downward opened parabolas (see FIG. 15b), $\epsilon$ can however not be adjusted to inherently compensate the scale factor's second order temperature dependence as any variation from 22.5° single pass Faraday rotation results in a decrease of the sensor's sensitivity, i.e. a drop of the scale factor as well. Nevertheless, by using a detuned half-wave retarder 16 instead of a quarter-wave retarder 16, i.e. by setting $\varepsilon'=\varepsilon-90°$, Eqs. (13, 14) become $$SF'_{\theta=\pm 45°} = \frac{V}{V_0} \frac{3-\cos(2\varepsilon' \pm 2\cot^{-1}\bar{x})}{4(1+\bar{x}^{-2})}, \quad (15)$$

$$SF'_{\theta=0°,90°} = \frac{V}{V_0} \frac{1}{4(1+\bar{x}^{-2})} \left[ 2 + \frac{1-\cos(2\varepsilon')}{1+\bar{x}^{-2}} \right]$$

The angle between the main axes of PM fiber 11 and the main axes of the PBS 29 in this case is still 45°, i.e. the angle between the polarization direction of the light exiting polarizing beams splitter 29 towards sensing fiber 17 and the main axes of retarder 16 is 0° and 90°, respectively.

The minus sign in front of the cosine term results in upward opened parabolas and, accordingly, half-wave retardation enables inherent compensation of the second order temperature dependence of the scale factor resulting from the temperature dependence of the Faraday rotation mirror, however, at the expense of an scale factor reduced roughly by a factor of two.

Notes:

In the presented embodiments, the angle between the main axes of quarter-wave or half-wave retarder and the PM fiber is set to 45°. If this angle differs from 45°, the retarder length and/or the spun fiber's angular orientation must be appropriately adapted to achieve the same sensor performance.

The actual embodiment of the disclosed invention can, e.g., employ elliptical core fiber for the quarter-wave retarder which is advantageous due to its relatively low temperature dependence. If, e.g., a stronger or lower temperature dependence of the retarder is needed for compensation, the retarder can alternatively be fabricated from Panda, Bow-Tie fiber, or micro-structured polarization-maintaining fiber. In principal, the QWR can be fabricated from any type of PM fiber. Another alternative is to fabricate the QWR from a spun fiber with varying pitch length [18].

The length of the spun fiber 17 and the length of the path from the polarizer (13, P1, P2, 29) (or polarizing modulator 31) to the retarder 16 is chosen such that parasitic light waves which may be generated by modal cross-coupling along this path accumulate differential group delays such that they are incoherent when they return to the polarizer (or polarizing modulator). Mathematically, this design rule can be expressed as follows: All involved fiber lengths need to be chosen so that $$\left| \sum_{i: optical\ paths} (y_i \Delta L_{g_i}) \right| > \frac{\lambda^2}{\Delta\lambda}$$

for all possible combinations of $y_i=2, 1, 0, 1, 2$, where the index i labels the optical paths i between two cross coupling points of the optical circuit and $\Delta L_{g_i}$ is the differential modal group delay of the optical path i, with at least one optical path k so that $$|y_k \Delta L_{g_k}| > \frac{\lambda^2}{\Delta\lambda}.$$

A cross coupling point is a point where the eigenmodes of a first optical path are not coupled one to one into the eigenmodes of a second optical path attached to the first optical path. E.g., a cross coupling point can be given by a fiber splice, a retarder, a mirror, or a fiber fixture at an integrated optics chip. The length of retarder 16 can as well be chosen so that the corresponding phase shift is close to 90°+n×180° if retarder 16 is a detuned quarter-wave retarder (i.e. in all embodiments except the one of FIG. 12) or n×180° if retarder 16 is a detuned half-wave retarder (i.e. the embodiment of FIG. 12 or FIG. 14), where n is a positive integer number. This is especially helpful to increase the temperature dependence of the retardation.

In the case of the Faraday rotator setups, a single pass rotation angle deviating from 22.5° can be chosen so that the resulting first order temperature dependence of the scale factor balances other contributions to the overall temperature dependence. Typically, the Faraday-rotator is prepared to have, for the center wavelength of light source 10, a rotation of 22.5°+j·45°±10°, in particular 22.5°+j·45°±5°, with j being an integer number, including 0.

Instead of a Faraday rotation mirror 30 at the end of sensing fiber 17, a transmission Faraday rotator separate from the mirror can be employed at any position between retarder and fiber end. The preferred sensor parameters may be slightly altered in this case.

The actual type of spun sensing fiber that is used for the disclosed invention can be freely chosen. Micro-structured fibers or elliptical core spun fibers may be preferred due to their low temperature dependence. However, the invention equally applies to Panda or Bow-Tie type spun fibers and grants inherent temperature compensation even for spun fibers with a strongly temperature dependent birefringence.

As already stated, the detection scheme presented in FIG. 2 can be modified: E.g., an open loop detection scheme can be used or the electro-optic modulator can be replaced by magneto-optic or piezo-electric modulators [2]. Similarly, the polarimetric detection schemes (e.g. as shown in FIG. 8) can be varied.

The devices described above combine the advantages of a highly-birefringent spun fiber, namely simple coil assembly (no removal of the coating needed, nor any packaging of bare silica fiber in a glass capillary, a wide range of possible fiber coil diameters (from a few centimeters to several meters) and no limitation of the number of fiber loops (thereby enabling high current resolution), with an inherently low temperature dependence.

It should be noted though that, instead of using PM fiber 11, the light from the polarizer and beam splitter can also directly be coupled into the retarder.

Retarder 16 is commonly spliced to the sensing fiber. Depending on the type of splicing machine (filament splicers or arc fusion splicers), the fiber type, and the splicer settings (thermal power and duration), the splice process can alter the spun fiber properties in the vicinity of the splice. As a result the effective angular orientation θ of the spun fiber with regard to the retarder axes may slightly change during the process. The herein disclosed temperature compensation concept is still possible by proper adaptation of ε. In this case, θ=±45° is preferred since here the optimum choice of the retardation ε is least sensitive to θ (see e.g. FIG. 6a). Alternatively, an appropriate offset may be given to the angle θ that compensates for the effect of the splice process. Also, splice procedure and the involved fiber types can be optimized to reduce this effect.

The sensors according to this disclosure are suitable for ac as well as dc measurements.

The technique adapts the inherent temperature compensation mechanism that was known in prior art for low-birefringent sensing fibers to the case of highly-birefringent spun sensing fibers. Also, a sensor configuration is disclosed that is optimized for minimized current non-linearity, i.e., for high electrical currents.

The parameters of the spun fiber, the wave retarder at the entrance to the spun fiber, and the light source can be chosen such that the temperature dependence and/or the nonlinearity of the sensor are minimized. Those parameters include the linear beat length, spin pitch, and modal group delay of the spun fiber, the phase retardation and principal axes orientation of the retarder with respect to the spun fiber axes, and the coherence length of the light source.

The disclosed sensor configuration can be advantageously designed according to the following strategy:

The minimum spun fiber length is chosen with respect to the spectral width of the light source.

The retarder length and retarder orientation with respect to the spun fiber axes are adjusted in dependence of the spun fiber parameters so that the temperature dependence or the current non-linearity of the sensor is minimized.

REFERENCES

[1] G. Frosio and R. Dändliker, Reciprocal reflection interferometer for a fiber-optic Faraday effect current sensor, Appl. Opt. 33, 6111 (1994).
[2] K. Bohnert, P. Gabus, J. Nehring, and H. Brändle, "Temperature and vibration insensitive fiber-optic current sensor", J. Lightwave Technology 20, 267 (2002).
[3] D. Tang, A. H. Rose, G. W. Day, and S. M. Etzel, "Annealing of linear birefringence in single-mode fiber coils: applications to optical fiber current sensors", J. Lightwave Technology 9, 1031 (1991).
[4] EP 1 512 981 A1.
[5] EP 2 306 212.
[6] R. I. Laming and D. N. Payne, Electric current sensors employing spun highly birefringent optical fibers, J. Lightwave Technology 7, 2084 (1989).
[7] I. G. Clarke, Temperature-stable spun elliptical-core optical-fiber current transducer, Opt. Lett. 18, 158 (1993).
[8] A. Michie et al., Spun elliptically birefringent photonic crystal fibre, Opt. Expr. 15, 1811 (2007).
[9] DE 10 000 306.
[10] "The fiber-optic gyroscope", Herve Lefevre, Artech House, Boston, London, 1993.
[11] WO 2007/121592.
[12] F. Briffod et al., Polarimetric current sensor using in-line Faraday rotator, IEICE Trans. Electron. Vol. E83-C, 331 (2000).
[13] K. Kurosawa et al., Flexible fiber Faraday effect current sensor using flint glass fiber and reflection scheme, IEICE Trans. Electron. Vol. E83-C, 326 (2000) and Optical Fibre Sensors Conference 13, 1999 Apr. 12-16, 1999, Kyongju, Korea.
[14] J. R. Qian, Q. Guo, and L. Li, Spun linear birefringence fibres and their sensing mechanism in current sensors with temperature compensation, IEE Proc. Optoelectronics 141, 357 (1994).
[15] R. Dändliker, Rotational Effects of Polarization in Optical Fibers. In: Anisotropic and Nonlinear Optical Waveguides, C. G. Someda and G. Stegman (Eds.), Elsevier (1992).
[16] R. C. Jones, A new calculus for the treatment of optical systems, J. Opt. Soc. Am. 31, 48 (1941).
[17] K. Bohnert et al., Fiber-Optic Current Sensor for Electrowinning of Metals, J. Lightwave Technology 25, 3602 (2007).
[18] H. Huang, Fiber optic analogs of bulk-optic waveplates. Appl. Opt. 36, 4241 (1997).
[19] EP 1 154 278 A2.

The invention claimed is:

1. A fiber-optic current sensor comprising
a light source generating light in a wavelength range,
a first linear polarizer receiving light from the light source and generating polarized light,
a retarder receiving light from the first linear polarizer and having a retardation $\rho = n \cdot 90° + \varepsilon$, with n being an integer number and $\varepsilon$ being a deviation from a retardation,
a spun sensing fiber being wound N times into a loop to be placed around a current conductor carrying a current I, having a Verdet-constant V, a spin pitch $p \leq 100$ mm, and, in said wavelength range, an average linear beat length $\overline{L_{LB}} \leq 200$ mm, wherein the average linear beat length is a linear beat length of a corresponding unspun fiber, wherein an input end of the spun sensing fiber receives light from the retarder, wherein a slow axis of the retarder is under an angle $\theta$ to a slow axis of the input end,
a detector assembly adapted to determine a phase shift $\Delta\phi$ between two polarization modes of light returning from said sensing fiber and to generate a signal indicative of said current,
wherein the retarder is dimensioned such that it introduces a temperature dependence that counteracts the combined contributions to the scale factor temperature dependence of the Verdet constant V, the linear beat length $\overline{L_{LB}}$, the spin pitch p, and the bend-induced birefringence $\delta_b$.

2. The current sensor of claim 1, wherein the retardation $\rho$ is such that, for a given nominal magneto-optical phase shift 4NVI, temperature changes of the retarder yield variations of a temperature-smoothed normalized sensor scale factor SF'($\rho$, $\overline{L_{LB}}$, p, $\theta$, NVI, $\delta_b$) that balance scale factor variations due to temperature changes of the spun sensing fiber in the sense that $$\left|\frac{1}{SF'}\frac{dSF'}{dT}\right| < \left|\frac{1}{V}\frac{dV}{dT}\right|, \left|\frac{1}{SF'}\frac{dSF'}{dT}\right| < \left|\frac{1}{V}\frac{dV}{dT}\right| \text{ with}$$

$$\frac{dSF'}{dT} = \frac{d\rho}{dT}\frac{dSF'}{d\rho} + \frac{d\overline{L_{LB}}}{dT}\frac{dSF'}{d\overline{L_{LB}}} + \frac{dp}{dT}\frac{dSF'}{dp} + \frac{dV}{dT}\frac{dSF'}{dV} + \frac{d\delta_b}{dT}\frac{dSF'}{d\delta_b},$$

wherein said temperature-smoothed normalized scale factor SF' is defined as an average of a non-temperature-smoothed normalized scale factor SF=$\Delta\phi/(4NV_0I)$ averaged over a temperature range that has a width of 20° C., with $V_0$ being the Verdet constant at a chosen reference temperature and $\delta_b$ is a bend-induced birefringence, and
wherein NVI is N*V*I*.

3. The current sensor of claim 2, wherein 4NVI is in a given nominal phase shift range $[\Delta\phi_{min}, \Delta\phi_{max}]$ with $|\Delta\phi_{max} - \Delta\phi_{min}| \geq 10°$, wherein $\Delta\phi_{min}$ is a minimum nominal phase shift and $\Delta\phi0_{max}$ is a maximum nominal phase shift.

4. The current sensor of claim 3, wherein said nominal phase shift range $[\Delta\phi_{min}, \Delta\phi_{max}]$ is [0°, 30°].

5. The current sensor of claim 3, wherein said nominal phase shift range $[\Delta\phi_{min}, \Delta\phi_{max}]$ extends over a range of [30°, 90°] and/or [90°, 180°] and/or [180°, 360°].

6. The current sensor of claim 3, wherein $\min(|\Delta\phi_{min}|, |\Delta\phi_{max}|) \geq 30°$.

7. The current sensor of claim 3, wherein $\min(|\Delta\phi_{min}|, |\Delta\phi_{max}|) \geq 60°$.

8. The current sensor of claim 1, wherein $|\epsilon| < 30°$.

9. The current sensor of claim 1, wherein $1° < |\epsilon| < 30°$.

10. The current sensor of claim 1, wherein $$|\Sigma_{i:\,optical\,paths}(y_i \Delta L_{g_i})| > \frac{\lambda^2}{\Delta\lambda}$$

for all possible combinations of $y_i = -2, -1, 0, 1, 2$, wherein index i labels birefringent waveguide sections that the light passes between the linear polarizer and the detector assembly and $\Delta L_{g_i}$ is a differential modal group delay of the birefringent waveguide section i, with at least one waveguide section k being such that that $$|y_k \Delta L_{g_k}| > \frac{\lambda^2}{\Delta\lambda},$$

wherein $\lambda$ is a center wavelength of said wavelength range and $\Delta\lambda$ is a full width at half maximum of said wavelength range.

11. The current sensor of claim 1, wherein a spectral full width at half maximum of said light source is such that $$\frac{l \cdot \Delta\lambda}{\overline{x} \cdot \overline{L_{LB}} \cdot \lambda} \gg 1,$$

wherein l is a length of said spun sensing fiber, $\overline{x} = 2 \cdot \overline{L_{LB}}/\rho$, $\lambda$ is a center wavelength of said wavelength range and $\Delta\lambda$ is a full width at half maximum of said wavelength range.

12. The current sensor of claim 1, wherein said spun sensing fiber has two non-circular eigenmodes and wherein said angle $\theta$ and said retardation $\rho$ are such that light components coupled in each of said eigenmodes have unequal intensities $I_1$, $I_2$ with $I_1:I_2 = 0.01 \ldots 0.99$ or $1.01 \ldots 100$.

13. The current sensor of claim 1, wherein said angle $\theta$ is equal to $0 \pm 10°$, or $\pm 45° \pm 10°$, or $\pm 90° \pm 10$.

14. The current sensor of claim 13, wherein said angle $\theta$ is equal to $0 \pm 5°$, or $\pm 45° \pm 5°$, or $\pm 90° \pm 5°$.

15. The current sensor of claim 1, further comprising a beam splitter module, wherein the beam splitter module has a first, second, third and fourth port and splits light incoming through the first port to the second, third and fourth ports, wherein the first and second ports are arranged between the first polarizer and the spun sensing fiber such that light from the first polarizer (enters the second port and light from the spun sensing fiber enters the first port, wherein the detector assembly comprises first and second light detectors and first and second linear polarizers arranged between the third port and the first light detector and the fourth port and the second light detector, respectively, with polarization axes of the first and second polarizers being oriented to be mutually perpendicular.

16. The current sensor of claim 1, wherein the detector assembly comprises:
   a differential phase modulator arranged between the first polarizer and the retarder,
   a control unit for modulating a phase shift imparted by the differential phase modulator, and
   a light detector located to measure an intensity of light returning from the spun sensing fiber through the differential phase modulator and the first polarizer.

17. The current sensor of claim 1, wherein the detector assembly comprises a Y-type phase modulator arranged between the first polarizer and the retarder,
   a control unit for modulating a phase shift imparted by the Y-type phase modulator, and
   a light detector located to measure an intensity of light returning from the spun sensing fiber through the Y-type phase modulator and the first polarizer.

18. The current sensor of claim 17, wherein the y-type phase modulator incorporates the first polarizer.

19. The current sensor of claim 1, further comprising a mirror at an end of the spun sensing fiber and a Faraday rotator having a rotation of $22.5° + j \cdot 45° \pm 10°$, in particular $22.5° + j \cdot 45° \pm 5°$, arranged between the retarder and the mirror, wherein j is an integer number including 0.

20. The current sensor of claim 1, further comprising a polarization maintaining fiber arranged between the first polarizer and the retarder.

21. The current sensor of claim 1, wherein $\rho \leq 15$ mm, and, in said wavelength range, $\overline{L_{LB}} \leq 30$ mm.

* * * * *